US009960306B2

(12) United States Patent
Nakagawa et al.

(10) Patent No.: US 9,960,306 B2
(45) Date of Patent: May 1, 2018

(54) CONDENSING PHOTOELECTRIC CONVERSION APPARATUS AND SYSTEM

(71) Applicant: Panasonic Intellectual Property Management Co., Ltd., Osaka (JP)

(72) Inventors: Tohru Nakagawa, Shiga (JP); Akio Matsushita, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 240 days.

(21) Appl. No.: 14/683,606

(22) Filed: Apr. 10, 2015

(65) Prior Publication Data
US 2015/0214407 A1 Jul. 30, 2015

Related U.S. Application Data

(63) Continuation of application No. PCT/JP2014/002744, filed on May 26, 2014.

(30) Foreign Application Priority Data

Jun. 13, 2013 (JP) .................................. 2013-124582

(51) Int. Cl.
*H01L 31/055* (2014.01)
*H01L 31/02* (2006.01)
(Continued)

(52) U.S. Cl.
CPC ...... *H01L 31/055* (2013.01); *H01L 31/02008* (2013.01); *H01L 31/0475* (2014.12);
(Continued)

(58) Field of Classification Search
CPC ... H01L 31/055; H01L 31/0543; H02S 40/22; G02B 3/0062
See application file for complete search history.

(56) References Cited

U.S. PATENT DOCUMENTS 4,268,709 A * 5/1981 Boling ..................... F21K 2/00
136/247
6,266,166 B1 * 7/2001 Katsumata ........... G03H 1/0256
156/244.27
(Continued)

FOREIGN PATENT DOCUMENTS

JP 10-51020 * 2/1998 ........... H01L 31/042
JP 2002-270882 9/2002
(Continued)

OTHER PUBLICATIONS

JP10-51020, Machine Translation, Feb. 1998, Tsutsui.*
(Continued)

*Primary Examiner* — Devina Pillay
(74) *Attorney, Agent, or Firm* — Wenderth, Lind & Ponack, L.L.P.

(57) ABSTRACT

A condensing photoelectric conversion apparatus includes a first photoelectric conversion module and a second photoelectric conversion module. The first and second condensing photoelectric conversion modules each include a power generating element, a condensing lens located on the power generating element and having a front surface with a convex portion and a flat rear surface, a transparent first resin located between the power generating element and the rear surface of the condensing lens, a colored second resin located on the rear surface of the condensing lens and around the power generating element, and a third resin located between the condensing lens of the first photoelectric conversion module and the condensing lens of the second photoelectric conversion module, and having a refractive index $n_1$ satisfying a relational expression $n_0 - 0.05 \leq n_1 \leq n_0 + 1.0$ with a refractive index $n_0$ of the condensing lens.

14 Claims, 28 Drawing Sheets

(51) Int. Cl.
*H01L 31/0475* (2014.01)
*H01L 31/054* (2014.01)
*H02S 40/22* (2014.01)

(52) U.S. Cl.
CPC .......... *H01L 31/0543* (2014.12); *H02S 40/22* (2014.12); *Y02E 10/52* (2013.01)

(56) References Cited

U.S. PATENT DOCUMENTS

| | | | | | |
|---|---|---|---|---|---|
| 2008/0006323 | A1* | 1/2008 | Kalkanoglu | ........... | H01L 31/048 136/253 |
| 2010/0326494 | A1* | 12/2010 | Okamoto | ................. | F24J 2/085 136/246 |
| 2012/0180865 | A1* | 7/2012 | Okaniwa | ................. | C09K 11/06 136/257 |
| 2012/0187439 | A1* | 7/2012 | Bosch | ............... | H01L 31/02008 257/98 |
| 2014/0090692 | A1 | 4/2014 | Okamoto et al. | | |
| 2014/0124016 | A1 | 5/2014 | Iwasaki et al. | | |

FOREIGN PATENT DOCUMENTS

| | | |
|---|---|---|
| JP | 2010-147440 | 7/2010 |
| JP | 2012-256783 | 12/2012 |
| WO | 2009/063822 | 5/2009 |
| WO | 2012/160994 | 11/2012 |

OTHER PUBLICATIONS

International Search Report dated Jul. 15, 2014 in International (PCT) Application No. PCT/JP2014/002744.
International Preliminary Report on Patentability and Written Opinion of the International Searching Authority dated Dec. 23, 2015 in International (PCT) Application No. PCT/JP2014/002744.

\* cited by examiner

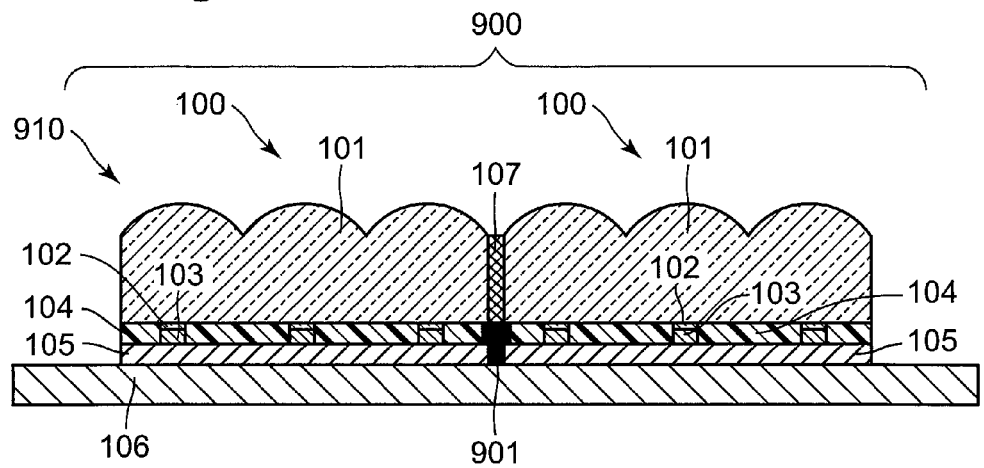
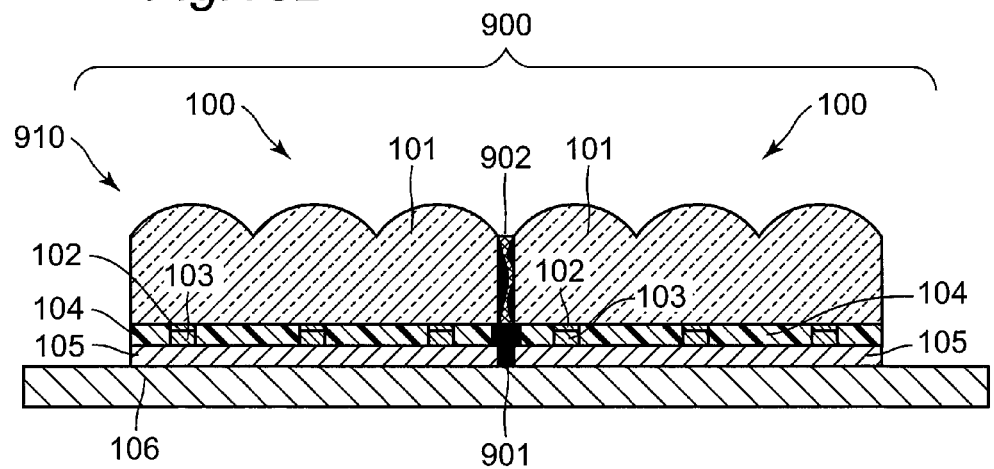

US 9,960,306 B2

CONDENSING PHOTOELECTRIC CONVERSION APPARATUS AND SYSTEM

CROSS-REFERENCE TO RELATED APPLICATIONS

This is a continuation application of International Application No. PCT/JP2014/002744, with an international filing date of May 26, 2014, which claims priority of Japanese Patent Application No.: 2013-124582 filed on Jun. 13, 2013, the content of which is incorporated herein by reference.

TECHNICAL FIELD

The technical field relates to a condensing photoelectric conversion apparatus having a uniform outer color and a condensing photoelectric conversion system.

BACKGROUND ART

Patent Literature 1 discloses a conventional condensing photoelectric conversion apparatus having various outer colors. The condensing photoelectric conversion apparatus described in Patent Literature 1 includes a substrate and a plurality of disposed primary power generation structures integrally provided with the substrate. The primary power generation structures each have a power generating element provided on the substrate and configured to convert light to electricity, and a condensing lens provided above the power generating element. Each of the primary power generation structures has a color scheme member that is located on the substrate at a position different from that of the power generating element. The color scheme members of the primary power generation structures each function as a pixel so that the pixels in the entire apparatus form an image.

CITATION LIST

Patent Literature

Patent Literature 1: JP 2012-256783 A

SUMMARY OF THE INVENTION

In the conventional condensing photoelectric conversion apparatus, however, the color scheme members viewed through the condensing lens appear ununiform in color, in other words, the entire apparatus appears ununiform in color.

One non-limiting and exemplary embodiment provides a condensing photoelectric conversion apparatus having a uniform outer color and a condensing photoelectric conversion system including the condensing photoelectric conversion apparatus.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature: a condensing photoelectric conversion apparatus comprising:

a first photoelectric conversion module; and
a second photoelectric conversion module,
wherein the first photoelectric conversion module and the second photoelectric conversion module each comprise:

a power generating element,
a condensing lens located on the power generating element, the condensing lens having a front surface with a convex portion and a flat rear surface,
a transparent first resin located between the power generating element and the rear surface of the condensing lens,
a colored second resin located on the rear surface of the condensing lens and around the power generating element, and
a third resin located between the condensing lens of the first photoelectric conversion module and the condensing lens of the second photoelectric conversion module, the third resin having a refractive index $n_1$ satisfying a relational expression $n_0-0.05 \le n_1 \le n_0+1.0$ with a refractive index $n_0$ of the condensing lens.

These general and specific aspects may be implemented using a system, a method, and a computer program, and any combination of systems, methods, and computer programs.

In the condensing photoelectric conversion apparatus and system according to the this aspect of the present disclosure, the resin having a refractive index satisfying the predetermined relational expression with the refractive index of the condensing lens is located between adjacent lens arrays. Scattering light exiting from the colored resin can efficiently reach an observer. Accordingly, an end of the photoelectric conversion module in the condensing photoelectric conversion apparatus and system hardly appears whiter than the remaining portion. The outer color of the condensing photoelectric conversion apparatus can be thus made substantially the same as the color of the colored resin provided in the photoelectric conversion module, and the outer color of the entire apparatus can be made uniform. Accordingly, the condensing photoelectric conversion apparatus and system can be designed in any color depending on the purpose of use.

BRIEF DESCRIPTION OF THE DRAWINGS

These and other aspects and features of the present disclosure will become clear from the following description taken in conjunction with the embodiments thereof with reference to the accompanying drawings, in which:

FIG. 13A is a schematic sectional view showing a state before deterioration, of the condensing photoelectric conversion apparatus according to the third embodiment of the present disclosure;

FIG. 13B is a schematic sectional view showing a state after deterioration, of the condensing photoelectric conversion apparatus according to the third embodiment of the present disclosure;

DETAILED DESCRIPTION (Finding as Basis of the Disclosure)

Figure 16A:
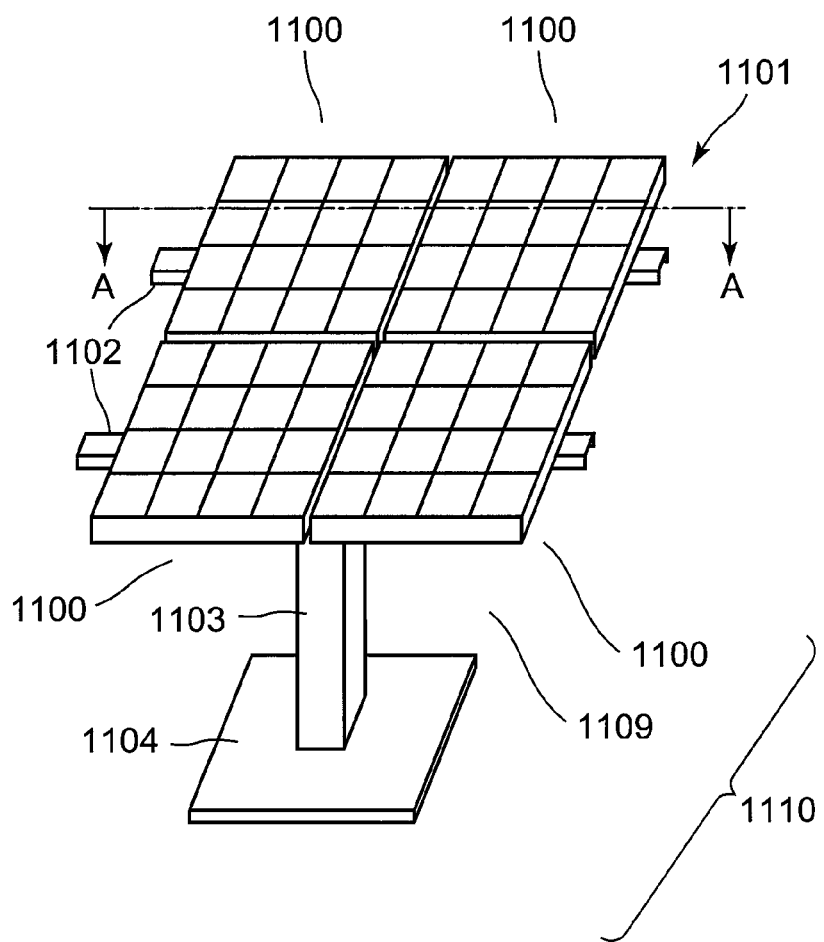
FIG. 16A is a schematic perspective view of a conventional condensing photoelectric conversion apparatus.
Figure 16B:
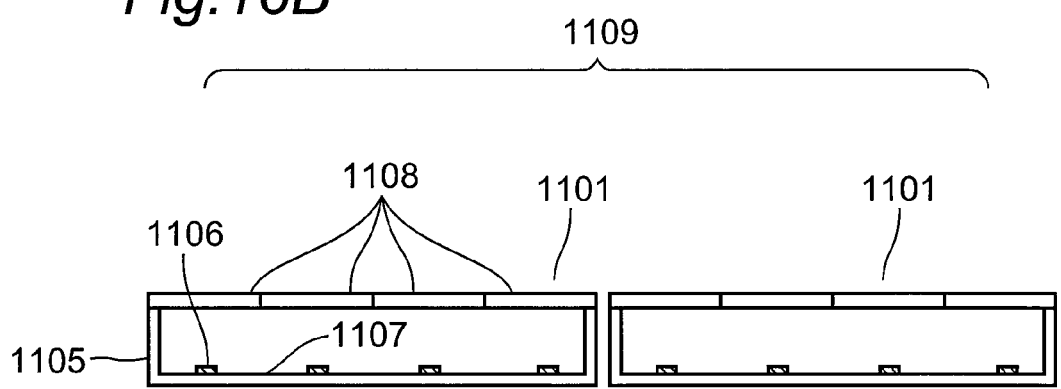
FIG. 16B is a schematic sectional view of a conventional condensing photoelectric conversion apparatus.
Figure 16C:
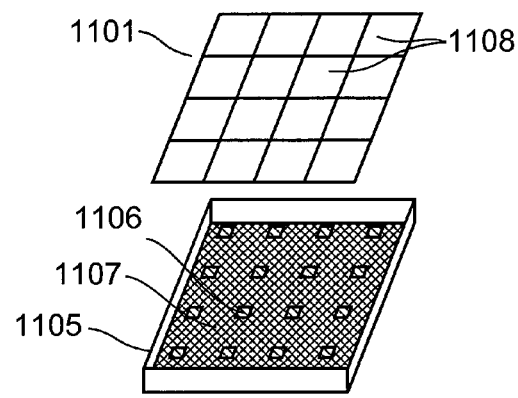
FIG. 16C is a schematic exploded perspective view of one of modules in the conventional condensing photoelectric conversion apparatus.

FIGS. 16A to 16C are schematic views of a condensing photoelectric conversion system and an condensing photoelectric conversion apparatus disclosed in Patent Literature 1. FIGS. 16A to 16C are not the same as those figures disclosed in Patent Literature 1, but correctly illustrate the features of the disclosure.

FIG. 16A is a schematic appearance view of a conventional condensing photoelectric conversion system 1110. The system 1110 includes four condensing photoelectric conversion modules 1100, frames 1102 supporting these modules, a pillar 1103 supporting the frames 1102, and a base 1104 fixing the pillar 1103. The four condensing photoelectric conversion modules 1100 and the frames 1102 supporting these modules are collectively referred to as a "condensing photoelectric conversion apparatus". Although not shown in FIG. 16A, the condensing photoelectric conversion system is equipped with a drive unit configured to move a condensing photoelectric conversion apparatus 1109 such that the condensing photoelectric conversion apparatus 1109 faces the sun.

FIG. 16B is a schematic sectional view taken along line A-A, of the two condensing photoelectric conversion apparatuses 1109. As shown in this figure, the condensing photoelectric conversion modules 1100 each include a lens array 1101 configured to condense sunlight, power generating elements 1106, a box 1105, and a colored portion 1107. The power generating elements 1106 are fixed to a flat portion of the box 1105. The portion other than the power generating elements 1106 in the flat portion of the box 1105 is colored to configure the colored portion 1107. The lens array 1101 is fixed to the top of the box 1105.

FIG. 16C is a schematic exploded view of the condensing photoelectric conversion module 1100. As shown in FIG. 16C, the lens array 1101 includes 16 condensing lenses 1108, for example. The power generating elements 1106 are located respectively at focal positions of the condensing lenses 1108. When sunlight vertically enters the lens array 1101, the sunlight condensed by the lenses 1108 is applied respectively to the power generating elements 1106. The power generating elements 1106 convert sunlight energy thus received to electrical energy.

The colored portion 1107 is provided around the power generating elements 1106. When the condensing photoelectric conversion module 1100 is viewed obliquely, the color of the colored portion 1107 is recognized. Such an oblique direction is not perpendicular to the surface of the lens array 1101 included in the condensing photoelectric conversion module 1100 (e.g. 45 degrees).

The colored portion 1107 has no influence on the power generation function of the condensing photoelectric conversion apparatus.

Problems of a conventional condensing photoelectric conversion apparatus are described with reference to FIGS. 17A and 17B.

Figure 17A:
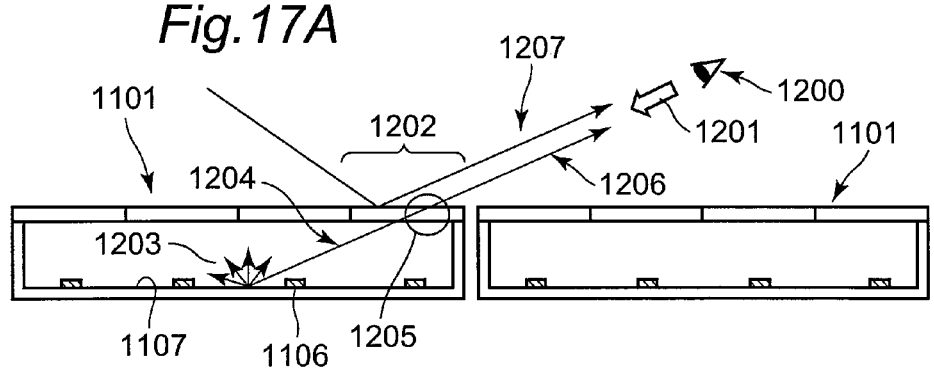
FIG. 17A is a schematic sectional view showing a state of a light ray reaching an observer who observes the conventional condensing photoelectric conversion apparatus.
Figure 17B:
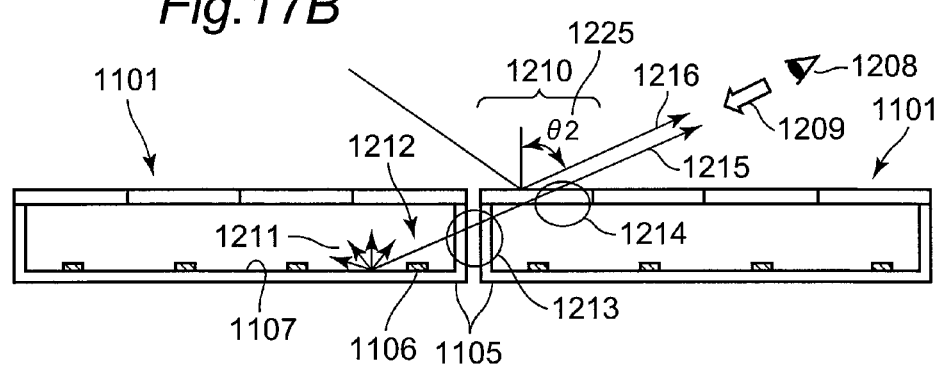
FIG. 17B is a schematic sectional view showing a state of a light ray reaching an observer who observes the conventional condensing photoelectric conversion apparatus.

FIGS. 17A and 17B are schematic sectional views of a condensing photoelectric conversion apparatus, illustrating how a color of the vicinity of a lens 1202 of a condensing photoelectric conversion module 1101 appears to an observer 1200 and how a color of the vicinity of a lens 1210 appears to an observer 1208, respectively. FIGS. 17A and 17B do not show a base 1102 fixing the condensing photoelectric conversion module 1101. While description is made with reference to these two figures for easier understanding, the observer 1200 is actually identical with the observer 1208 and this single observer simultaneously observes the vicinities of the lens 1202 and the lens 1210.

Figure 17C:
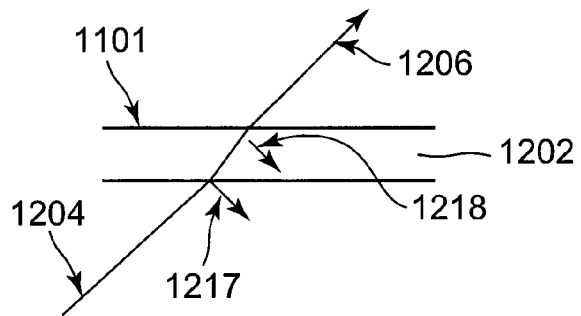
FIG. 17C is a schematic enlarged explanatory view of a region 1205, showing a state of a light ray reaching an observer who observes the conventional condensing photoelectric conversion apparatus.

FIG. 17A initially shows how the vicinity of the lens 1202 of the condensing photoelectric conversion module 1101 appears. Scattering light 1203 exits from one point in the colored portion 1107 in the condensing photoelectric conversion module 1101, and a light ray 1204 as part of the scattering light 1203 travels toward the observer 1200. This light ray passes through a surrounded region 1205 in the lens 1202 and reaches the observer 1200 as a light ray 1206. FIG. 17C is an enlarged view of the region 1205. As shown in FIG. 17C, the light ray 1204 is reflected twice, i.e., by the lens 1202 and an air interface. Light rays reflected by these interfaces are referred to as a light ray 1217 and a light ray 1218, respectively. The remaining light ray 1206 obtained by removing the reflected light rays 1217 and 1218 from the light ray 1204 reaches the observer 1200. The light ray 1204 reaches the observer 1200 with an intensity weaker than that of a case where the lens 1202 is not provided. The observer 1200 observing the light ray 1206 regards the portion of the lens 1202 as being colored. The observer 1200 also receives a light ray 1207 reflected by the lens 1202. The light ray 1207 includes all the wavelengths of sunlight, and the observer 1200 thus regards the light ray 1207 as being white. The observer 1200 accordingly regards the color of the lens 1202 as a mixture of the color of the colored portion 1107 and white. As the light ray 1204 is reflected larger in the region 1205, the color of the lens 1202 will appear in a color close to white.

Figure 17D:
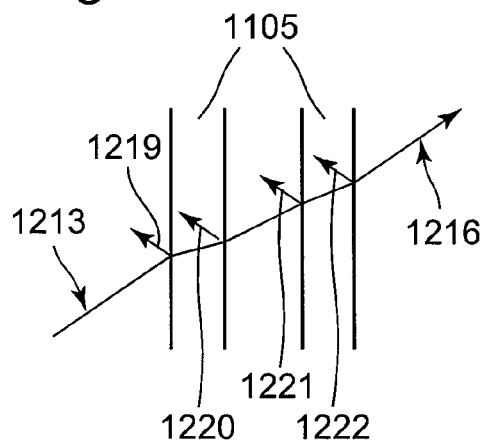
FIG. 17D is a schematic enlarged explanatory view of a region 1213, showing a state of a light ray reaching an observer who observes the conventional condensing photoelectric conversion apparatus.
Figure 17E:
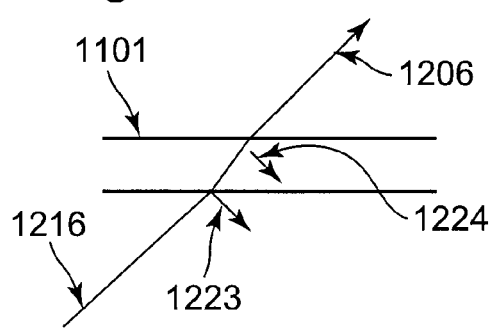
FIG. 17E is a schematic enlarged explanatory view of a region 1214, showing a state of a light ray reaching an observer who observes the conventional condensing photoelectric conversion apparatus.

FIG. 17B shows appearance of the vicinity of the lens 1210 at the left end (closer to the other module) of one of the two adjacent condensing photoelectric conversion modules 1101. A light ray 1212 in scattering light 1211 exiting from the colored portion 1107 travels toward the observer 1208. The light ray 1212 passes through two regions 1213 and 1214 and then reaches the observer 1208 as a light ray 1215. FIG. 17D is an enlarged view of the region 1213. FIG. 17E is an enlarged view of the region 1214. As shown in these figures, the light ray 1212 is reflected six times in total until the light ray 1212 reaches the observer 1208. The scattering light ray 1212 exiting from the colored portion 1107 and reaching the observer 1208 has an intensity weaker than that of a case where no lens is provided. The observer 1208 also receives a light ray 1216 reflected by the lens 1210. The light ray 1216 includes all the wavelengths of sunlight, and thus appears white to the observer 1208. The observer 1208 accordingly regards the color of the lens 1210 as a mixture of the color of the colored portion 1107 and white. As a light ray is reflected larger in the two regions 1213 and 1214, the color of the lens 1210 appears whiter.

The number of reflection of the scattering light ray 1212 in FIG. 17B is larger than the number of reflection of the scattering light ray 1204 in FIG. 17A. The lens 1210 appears whiter than the lens 1202 to the observer 1208. In the condensing photoelectric conversion apparatus, the end of the condensing photoelectric conversion module 1101 thus appears whiter than the center. The condensing photoelectric conversion apparatus accordingly appears ununiform in color. As described above, the conventional condensing photoelectric conversion module 1101 causes the entire apparatus to appear ununiform in color.

FIGS. 17A and 17B show only cases where the lenses 1202 and 1210 are observed at angles 1201 and 1209, respectively. Also in cases where other lenses are observed at various angles, these lenses each appear in a color obtained by adding white to the color of the colored portion 1107. Furthermore, the entire apparatus appears ununiform in color.

In view of the above, the inventors of the present disclosure studied eagerly to find that the condensing photoelectric conversion apparatus according to the present disclosure entirely appears more uniform in outer color than the conventional condensing photoelectric conversion apparatus when a third resin 107 having a refractive index substantially equal to that of the lens array is provided in a gap between the adjacent condensing photoelectric conversion modules. The present disclosure has been thus achieved.

Embodiments of the present disclosure are described below with reference to the accompanying drawings.

Before the detailed description of the embodiments of the present disclosure with reference to the drawings, various aspects of the present disclosure are described.

Examples of the disclosed technique are as follows.

1st aspect: A condensing photoelectric conversion apparatus comprising:

a first photoelectric conversion module; and a second photoelectric conversion module, wherein the first photoelectric conversion module and the second photoelectric conversion module each comprise:

a power generating element, a condensing lens located on the power generating element, the condensing lens having a front surface with a convex portion and a flat rear surface, a transparent first resin located between the power generating element and the rear surface of the condensing lens, a colored second resin located on the rear surface of the condensing lens and around the power generating element, and a third resin located between the condensing lens of the first photoelectric conversion module and the condensing lens of the second photoelectric conversion module, the third resin having a refractive index $n_1$ satisfying a relational expression $n_0-0.05 \leq n_1 \leq n_0+1.0$ with a refractive index $n_0$ of the condensing lens.

According to this aspect, the outer color of the condensing photoelectric conversion apparatus can be made substantially the same as the color of the colored resin provided in the photoelectric conversion module, and the outer color of the entire apparatus can be made uniform. The condensing photoelectric conversion apparatus can be thus designed in any color depending on the purpose of use.

2nd aspect: The condensing photoelectric conversion apparatus according to 1st aspect, wherein the refractive index $n_1$ of the third resin and the refractive index $n_0$ of the condensing lens satisfy a relational expression $n_0 \leq n_1 \leq n_0+1.0$.

According to this aspect, the outer color is uniform more reliably even at a small observation angle.

3rd aspect: The condensing photoelectric conversion apparatus according to 1st or 2nd aspect, wherein the second resin is a resin into which a pigment or a dye is mixed According to this aspect, scattering light from the third resin also reaches an observer. The condensing photoelectric conversion apparatus thus appears more uniform in outer color.

4th aspect: The condensing photoelectric conversion apparatus according to 1st or 2nd aspect, wherein the second resin is a resin containing a luminous agent.

According to this aspect, the second resin contains the luminous agent so as to be luminous at night. The apparatus can function as a lighting device at a location with no street lamp.

5th aspect: The condensing photoelectric conversion apparatus according to 1st or 2nd aspect, wherein the third resin is made of a material identical to a material for the second resin.

According to this aspect, scattering light from the third resin also reaches an observer. The condensing photoelectric conversion apparatus thus appears more uniform in outer color.

6th aspect: The condensing photoelectric conversion apparatus according to 1st or 2nd aspect, wherein the third resin is in contact with a silicone-based oil, and the silicone-based oil is located on the flat rear surface of the condensing lens.

According to this aspect, the silicone-based oil enters a gap or the like formed by deterioration of the third resin or the like due to surface tension to fill the gap or the like in the third resin. This configuration prevents decrease in uniformity of the outer color due to the gap or the like formed by deterioration of the third resin.

7th aspect: The condensing photoelectric conversion apparatus according to 6th aspect, wherein the silicone-based oil is a fluorine-modified silicone oil.

According to this aspect, when the silicone-based oil is a fluorine-modified silicone oil having small surface tension, such a silicone oil is more likely to enter a crack, a cavity, or the like in the gap in the third resin.

8th aspect: A condensing photoelectric conversion system comprising:

the condensing photoelectric conversion apparatus according to 1st or 2nd aspect; and a drive unit configured to drive the condensing photoelectric conversion apparatus.

According to this aspect, the outer color of the condensing photoelectric conversion apparatus can be made substantially the same as the color of the colored resin provided in the photoelectric conversion module, and the outer color of the entire apparatus can be made uniform. The condensing photoelectric conversion apparatus can be thus designed in any color depending on the purpose of use.

Embodiments of the present disclosure are described below with reference to the accompanying drawings.

First Embodiment

A condensing photoelectric conversion system 111 including a condensing photoelectric conversion apparatus 110 according to the first embodiment is summarized initially, and the condensing photoelectric conversion apparatus 110 is then described in detail.

Figure 1A:
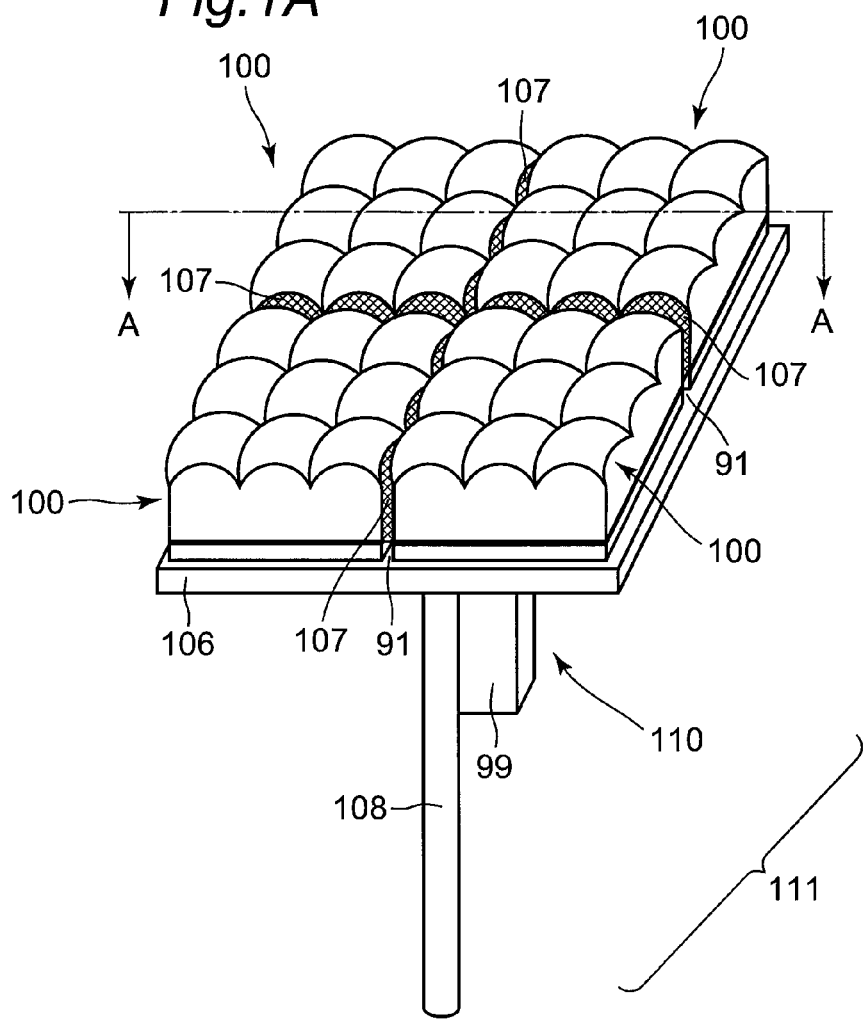
FIG. 1A is a schematic perspective view of a condensing photoelectric conversion system including a condensing photoelectric conversion apparatus according to a first embodiment of the present disclosure.
Figure 1B:
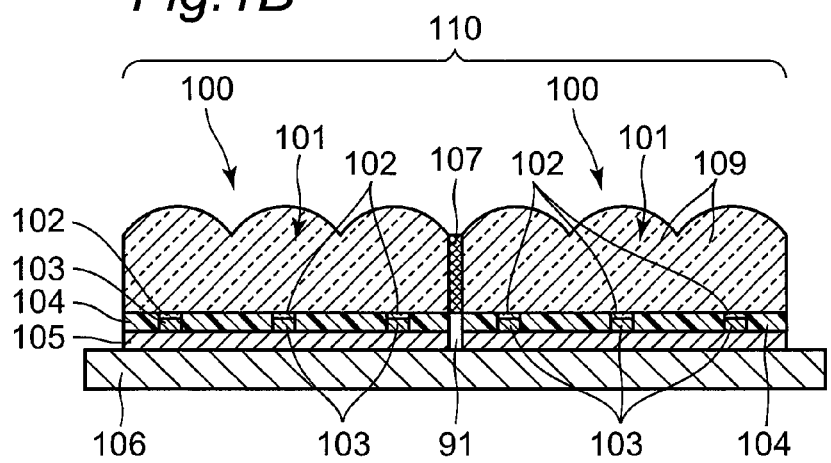
FIG. 1B is a sectional view taken along line A-A in FIG. 1A, of the condensing photoelectric conversion apparatus according to the first embodiment of the present disclosure.
Figure 1C:
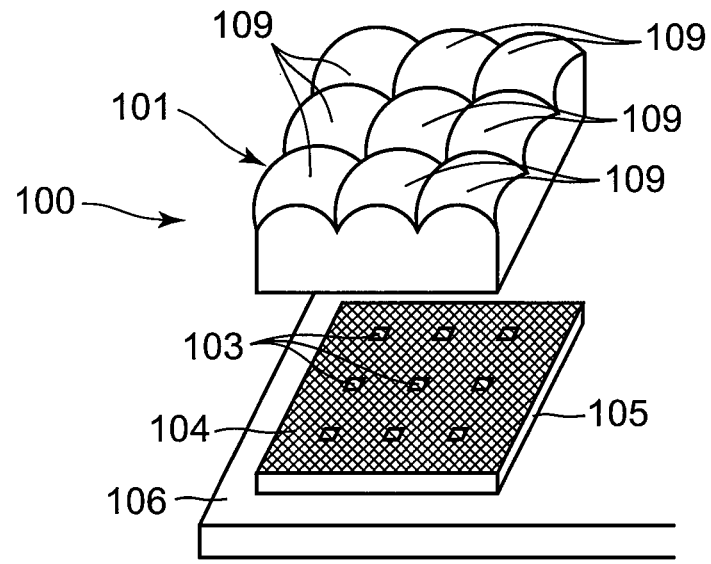
FIG. 1C is a schematic exploded perspective view of one of condensing photoelectric conversion modules in the condensing photoelectric conversion apparatus according to the first embodiment of the present disclosure.

FIGS. 1A to 1C are schematic views summarizing the condensing photoelectric conversion apparatus 110 and the condensing photoelectric conversion system 111 according to the first embodiment.

FIG. 1A is a schematic view of the condensing photoelectric conversion system 111.

The condensing photoelectric conversion system 111 includes the condensing photoelectric conversion apparatus 110, a support bar 108 supporting the condensing photoelectric conversion apparatus 110, and a drive unit 99 configured to move the condensing photoelectric conversion apparatus 110 relatively to the support bar 108.

The condensing photoelectric conversion apparatus 110 includes a plurality of (for example, four in FIG. 1A) condensing photoelectric conversion modules 100, and a base 106 supporting the condensing photoelectric conversion modules 100. All of the condensing photoelectric conversion modules 100 are located on the flat base 106 and are planarly fixed thereto. FIG. 1A exemplifies a case where the four condensing photoelectric conversion modules 100 each having a square shape are located adjacently and fixed onto the base 106 having a square shape. The adjacent condensing photoelectric conversion modules 100 have a minute gap 91 therebetween.

The drive unit 99 drives the condensing photoelectric conversion apparatus 110 so that the condensing photoelectric conversion apparatus 110 constantly faces the sun. The drive unit 99 is composed of a tracking drive unit, for example. The tracking drive unit is composed of a horizontal rotation drive unit and an elevation angle rotation drive unit, each being composed of any motor such as a DC motor, an AC motor, or a stepping motor and a hydraulic control mechanism, for example.

The drive unit 99 may include a light detector. The horizontal rotation drive unit rotates the condensing photoelectric conversion apparatus integrally with the light detector to the east or to the west in the horizontal direction toward the sun about a horizontal rotation axis. The elevation angle rotation drive unit similarly rotates the condensing photoelectric conversion apparatus integrally with the light detector to the south or to the north in the elevation angle direction toward the sun about an elevation angle rotation axis. The tracking drive unit is drive-controlled by a controller. The controller drive-controls the tracking drive unit in accordance with information on a detection result of the light detector, time information on sunrise and sunset which statistically differs in seasons, time information, and the like. In a case where the light detector is not provided, the controller drive-controls the tracking drive unit in accordance with time information on sunrise and sunset, time information, and the like.

Each of the condensing photoelectric conversion modules 100 includes power generating elements 103, condensing lenses 109, a transparent first resin 102, a colored second resin 104, and a third resin 107.

FIG. 1B is a schematic sectional view taken along line A-A in FIG. 1A. FIG. 10 is a schematic exploded view of one of the condensing photoelectric conversion modules 100. As shown in FIG. 1B, each of the condensing photoelectric conversion modules 100 includes the condensing lenses 101, the power generating elements 103 located respectively below the condensing lenses 101, the transparent first resin 102 located between the lower surfaces (rear surfaces) of the condensing lenses 101 and the power generating elements 103, and the colored second resin 104 located below the condensing lenses 101. In FIG. 1B, each of the condensing photoelectric conversion modules 100 further includes a circuit board 105.

The circuit board 105 is provided with electrodes (not shown) which are electrically connected to electrodes of the power generating elements 103. The circuit board 105 is in contact with the colored second resin 104.

As exemplified in FIG. 10, nine power generating elements 103 are located respectively at positions near focal points of nine condensing lenses 109 configuring a lens array 101. Sunlight condensed by the condensing lens 109 is applied to the corresponding power generating element 103, which generates electrical power. The colored second resin 104 is located around the power generating elements 103. The colored second resin 104 is provided in a flat portion (a planar region) on the rear surface of the lens array 101 except for the region of the transparent first resin 102.

As shown in FIGS. 1A and 1B, the gap 91 between the adjacent lens arrays 101 is provided with the third resin 107. As to be described in detail later, the third resin 107 has a refractive index that is substantially equal to the refractive index of a material for the lens arrays 101 or is in a range satisfying a predetermined expression to be described later.

Described in detail next is the configuration of each of the condensing photoelectric conversion modules 100 in the condensing photoelectric conversion apparatus 110 according to the first embodiment.

<Condensing Lens 109>

The lenses including the plurality of condensing lenses 109 are also referred to as the lens array 101. The plurality of condensing lenses 109 are located on an identical plane, for example. As one example of each of the condensing photoelectric conversion modules 100 has no gaps between the plurality of condensing lenses 109.

Each of the condensing lenses 109 is located on the first resin 102 and the second resin 104.

The condensing lenses 109 each have a front surface with a convex portion and a flat rear surface. The rear surface of the condensing lens 109 is in contact with the first resin 102 and the second resin 104. The rear surface of the condensing lens 109 has a condensing region and a colored region (other than the condensing region) not including a focal point of light incident on the convex portion on the front surface. The condensing region includes a region, in the rear surface of the condensing lens 109, where light incident on the condensing lens 109 and condensed by the convex portion on the front surface passes through.

The region where condensed light passes through in the rear surface of the condensing lens 109 is previously designed in accordance with the condensing lens 109 and the wavelength of incident light. The condensing region may include, in addition to the region where condensed light passes through, a position distant by a predetermined distance or less from the condensing region. As one example of the predetermined distance depends on a production error of the condensing lens 109 or the like. Energy of light passing through the desirably exemplified condensing region is 95% or more and less than 100% of energy of light passing through the rear surface of the condensing lens 109. Light not incident on the power generating element 103 can be reduced in amount even in a case where light passes through a region displaced from the previously designed region where light passes through in the rear surface of the condensing lens 109 due to a tracking error of the condensing photoelectric conversion apparatus 110.

In an exemplary case where the power generating element 103 is a GaAs-based thin film, the power generating element 103 converts light having a wavelength of 400 nm or more and 1400 nm or less to energy. Light in a wavelength region of 400 nm or more and 1400 nm or less is condensed by the condensing lens 109 and is applied to the rear surface of the condensing lens 109. As one example of the condensing region includes 95% or more of entire energy of sunlight applied to the rear surface of the condensing lens 109.

The power generating element 103 is located below the condensing region, and the colored second resin 104 is located below the colored region other than the condensing region. The condensing region is typically smaller than the region of the power generating element 103. The region not provided with the first resin basically corresponds to the colored region. The colored region according to the first embodiment is located in a region not provided with the power generating element 103, for example.

The condensing lens 109 is exemplified by a planoconvex lens. The planoconvex lens has a convex portion on a light receiving surface, and a flat surface on the reverse side of the light receiving surface.

In the lens array 101 shown in FIGS. 1A to 1C, nine planoconvex condensing lenses 109 are disposed two-dimensionally in three horizontal rows and three vertical columns, for example. The lens arrays 101 and the condensing lenses 109 shown in FIG. 1A each have a square shape when viewed from above, but are not limited thereto.

The lens arrays 101 have only to be shaped so as to be disposed two-dimensionally with no large gaps being formed therebetween. For example, the lens array 101 can have a square shape, a rectangular shape, a triangular shape, or a hexagonal shape. The condensing lenses 109 are not limited in shape, but, for example, the plurality of condensing lenses 109 have identical shapes.

When each of the condensing lenses 109 has a square shape, a rectangular shape, or a triangular shape, the plurality of condensing lenses 109 can be disposed two-dimensionally to form the lens array 101 in a square shape, a rectangular shape, a triangular shape, or a hexagonal shape.

The lens array 101 and the condensing lenses 109 are made of a resin or glass. Examples of the resin include polymethyl methacrylate (PMMA) resin and polycarbonate resin.

The lens array 101 or the condensing lenses 109 made of a resin can be produced by injection molding or extrusion molding. The lens array 101 or the condensing lenses 109 made of glass can be produced by extrusion molding.

After the resin material is molded into the shape of a planoconvex lens array by injection molding or extrusion molding (hereinafter, the molded product is referred to as a "lens array component"), a thin glass plate may be attached to a flat surface of the lens array component. In this case, the lens array 101 is defined as including both the lens array component made of a resin and the glass plate.

Thickness of the lens array 101 is determined by size of the condensing lenses 109 configuring the lens array 101. The thickness of the lens array 101 is approximately twice the length of a side of the condensing lens 109.

Entire size of the lens array 101 is determined by production capacity of an injection molding machine or an extrusion molding machine. For example, the lens array 101 is formed into a square shape having a side of 5 cm or more and 20 cm or less when viewed from above, in terms of facilitation in assembly of the condensing photoelectric conversion module 100. More specifically, the lens array 101 can have a square shape with a side of 5 cm or more and 10 cm or less. For example, the condensing lenses 109 each have a side of 0.4 cm or more and 2 cm or less. More specifically, the condensing lens 109 can have a side of 0.5 cm or more and 1 cm or less. In this case, the thickness of the lens array 101 is approximately 1 cm or more and 4 cm or less.

<Power Generating Element 103>

The power generating element 103 is located on a substrate. The substrate is exemplified by the circuit board 105 shown in FIG. 1A and the like.

The power generating element 103 has an upper surface in contact with the first resin 102 and side surfaces in contact with the second resin 104.

As shown in FIG. 1B, the power generating element 103 is located below the first resin 102. In other words, the power generating element 103 is located below the condensing region of the condensing lens 109. The power generating element 103 receives light condensed by the condensing lens 109 and converts the light to electrical energy.

The second resin 104 is located to be in contact with the side surfaces of the power generating element 103. As exemplified in FIGS. 1B and 1C, each of the power generating elements 103 is surrounded with the second resin 104 when viewed from above.

The transparent resin disclosed in the present DESCRIPTION is transparent for light in a wavelength region so as to be absorbed for generating an electromotive force by the power generating element 103. Transparency in this case indicates a transmittance of 80% or more. The first resin 102 is a transparent resin.

<First Resin 102>

The first resin 102 is a transparent resin located between the power generating element 103 and the condensing region of the condensing lens 109.

The first resin 102 transmits light received by the power generating element 103. More specifically, for example, the first resin 102 has a transmittance of a predetermined level or more for light in a wavelength range processed by the power generating element 103. The transmittance of the predetermined level or more is 80%, for example.

The wavelength range of light processed by the power generating element 103 is determined in accordance with the material for the power generating element 103.

Examples of the material for the first resin 102 include an epoxy resin, a silicone resin, an acrylic resin, and a polyolefin resin. The transparent first resin 102 is not limited in thickness, and is 0.1 μm to 10 μm, for example. More specifically, the thickness can be from 1 μm to 5 μm.

<Second Resin 104>

The second resin 104 is located in contact with the colored region of the condensing lens 109.

The second resin 104 shown in FIG. 1B is located on the side surfaces of each of the power generating elements 103. Each of the power generating elements 103 is surrounded with the second resin 104 when viewed from above.

For example, the colored second resin 104 is made of a material containing an epoxy resin, a silicone resin, an acrylic resin, or a polyolefin resin, as well as a dye, a pigment, or a luminous agent. Specific examples of a resin containing a dye include R-17 clear black (black), R-13 clear blue green (blue green), R-14 clear yellow (yellow), R-15 clear violet (violet), and R-10 clear blue (blue) manufactured by Blenny Giken Ltd. Specific examples of the luminous agent include LumiNova G-300 (the name of a product emitting yellowish green light) and LumiNova BG-300 (the name of a product emitting blue green light) manufactured by Nemoto & Co., Ltd.

<Third Resin>

The third resin 107 is located between the condensing lenses 109 of the two adjacent condensing photoelectric conversion modules 100, and has a refractive index satisfying a predetermined relational expression. The third resin 107 is located at least from the flat side surface, having no radius of curvature, of the condensing lens 109 to the interface between the colored second resin 104 and the condensing lens 109. The third resin 107 is not provided above the flat side surface because of deteriorating condensing efficiency of the condensing lens 109. The refractive index of the third resin 107, satisfying the predetermined relational expression, is to be described in detail later.

Figure 1D:
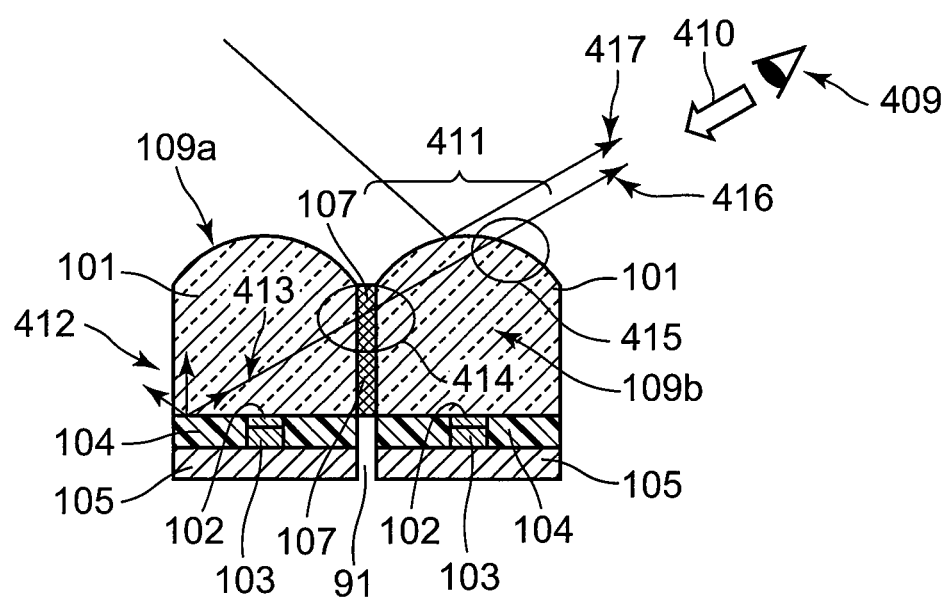
FIG. 1D is a schematic sectional view of a minimum unit in the condensing photoelectric conversion apparatus according to the first embodiment of the present disclosure.

FIG. 1D shows the basic configuration of the condensing photoelectric conversion apparatus 110 according to the first embodiment. When a plurality of condensing photoelectric conversion modules 100 each including at least one condensing lens 109 are disposed adjacently in FIG. 1D, the gap 91 is formed between a condensing lens 109a of a first photoelectric conversion unit (the condensing photoelectric conversion module 100) and a condensing lens 109b of a second photoelectric conversion unit (the condensing photoelectric conversion module 100). The third resin 107 is thus provided in the gap 91. FIG. 1D also shows a state of a light ray reaching an observer 409 who observes the condensing photoelectric conversion apparatus 110, to be described later.

<Structure of Condensing Photoelectric Conversion Module 100>

Figure 2A:
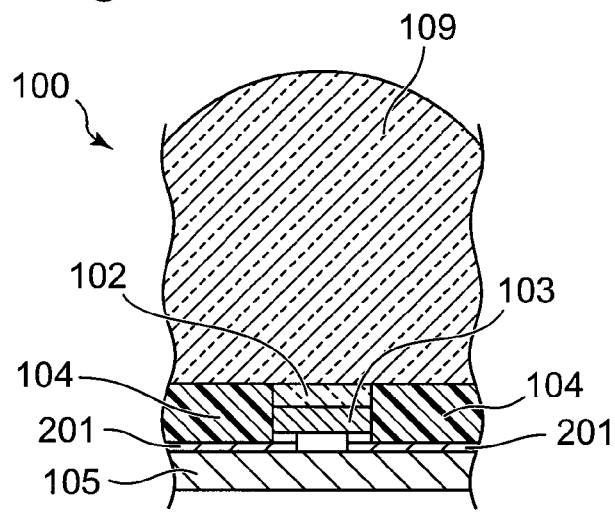
FIG. 2A is a schematic enlarged sectional view of the vicinity of a condensing lens of the condensing photoelectric conversion module according to the first embodiment of the present disclosure.
Figure 2B:
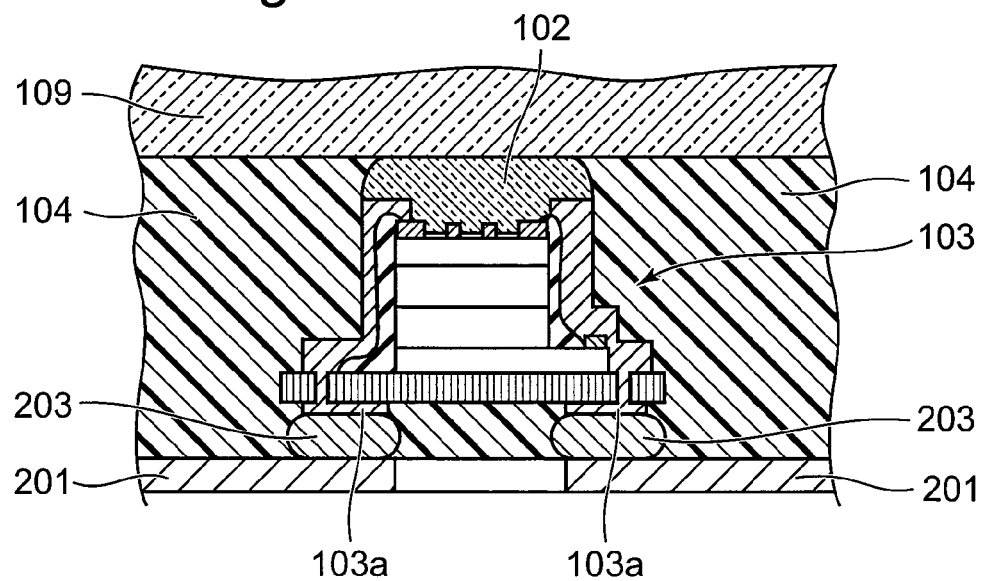
FIG. 2B is an enlarged sectional view of the condensing photoelectric conversion module shown in FIG. 2A, according to the first embodiment of the present disclosure.
Figure 2C:
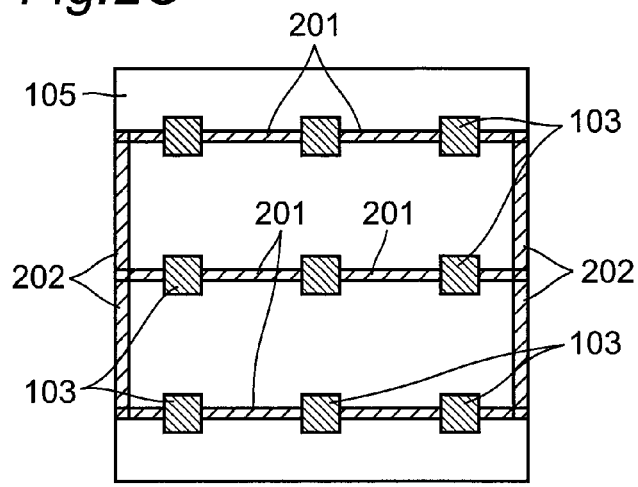
FIG. 2C is a schematic plan view showing positional relation between a power generating element and a circuit board in a state where a lens array, a first resin, and a second resin are removed virtually in the condensing photoelectric conversion module according to the first embodiment of the present disclosure.

FIGS. 2A to 2C are detailed schematic views of the condensing photoelectric conversion module 100 according to the first embodiment. FIG. 2A is a schematic sectional view of the condensing photoelectric conversion module 100 in the vicinity of the condensing lens 109.

As exemplified in FIG. 2A, the power generating element 103 is fixed, via the transparent first resin 102, to the flat rear surface of one of the condensing lenses 109 in the lens array 101. The colored second resin 104 is provided on the flat surface of the condensing lens 109. The power generating element 103 is not particularly limited in size. For example, the power generating element 103 has a side of 0.3 mm or more and 1 mm or less.

FIG. 2B is a schematic sectional view showing a detailed structure in the vicinity of the power generating element 103. The power generating element 103 has electrodes 103a that are located opposite to the transparent first resin 102. The electrodes 103a are electrically connected to electrodes 201 provided on the circuit board 105 by solder pastes 203.

FIG. 2C is a schematic plan view showing positional relation between the circuit board 105 and the power generating elements 103 in a state where the lens array 101, the transparent first resin 102, and the colored second resin 104 are removed virtually in the condensing photoelectric conversion module 100. The nine power generating elements 103 in total are disposed in three rows and three columns. The power generating elements 103 in the first to third rows are electrically connected in series by the electrodes 201, respectively. The power generating elements 103 connected in series in the first to third rows are connected in parallel by electrodes 202.

<Method of Producing Power Generating Element 103>

FIGS. 3A to 3G, FIG. 3H, and FIG. 3I are schematic sectional views showing an exemplary method of producing the power generating element 103 according to the first embodiment, a schematic sectional view of the power generating element 103 thus produced, and a schematic plan view thereof, respectively.

Figure 3A:
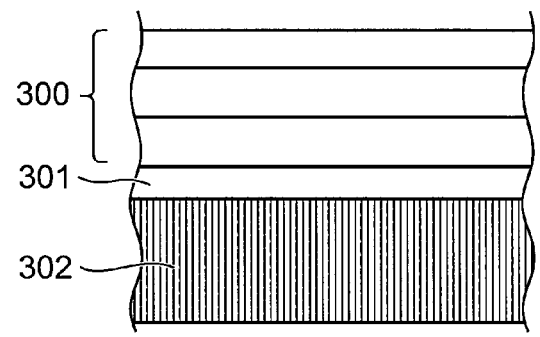
FIG. 3A is a schematic sectional view showing a method of producing the power generating element used in the condensing photoelectric conversion apparatus according to the first embodiment of the present disclosure.

As shown in FIG. 3A, a junction layer 301 of low resistance and a power generation layer 300 are provided on a semi-insulating substrate 302 of 4 inches to 6 inches, for example. The semi-insulating substrate 302 is exemplified by a GaAs substrate. The junction layer of low resistance is exemplified by a highly doped GaAs layer. The power generation layer 300 is exemplified by a GaAs-based thin film including three stacked PN junction layers. The power generation layer 300 is configured to allow photoelectric current to flow from the power generation layer 300 to the substrate 302. Although not shown in FIG. 3A, the power generation layer 300 is provided, at its upper most portion, with a highly doped junction layer. Subsequent FIGS. 3B to 3H show only the method of producing a single power generating element 103. Actually, a large number of power generating elements 103 provided on a wafer and each having a shape same as that of the wafer is formed at constant intervals.

Figure 3B:
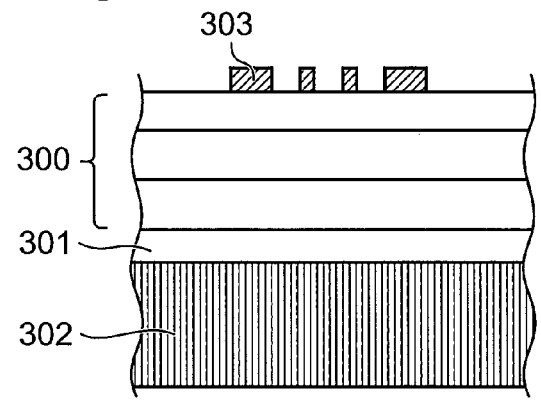
FIG. 3B is a schematic sectional view showing a method of producing the power generating element used in the condensing photoelectric conversion apparatus according to the first embodiment of the present disclosure.

As shown in FIG. 3B, the power generation layer 300 is provided, at its uppermost portion, with grid electrodes 303.

Figure 3C:
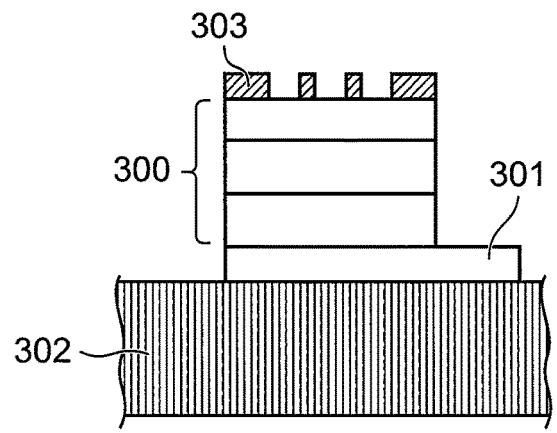
FIG. 3C is a schematic sectional view showing a method of producing the power generating element used in the condensing photoelectric conversion apparatus according to the first embodiment of the present disclosure.

Then, as shown in FIG. 3C, the power generation layer 300 and the junction layer 301 are patterned subsequently.

Figure 3D:
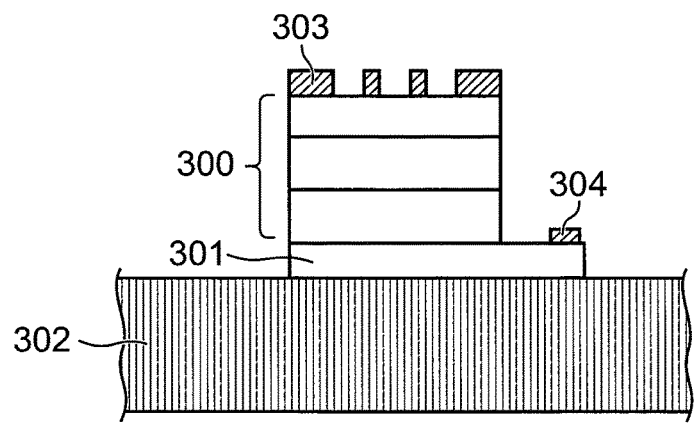
FIG. 3D is a schematic sectional view showing a method of producing the power generating element used in the condensing photoelectric conversion apparatus according to the first embodiment of the present disclosure.

As shown in FIG. 3D, an electrode 304 is then formed on the junction layer 301.

Figure 3E:
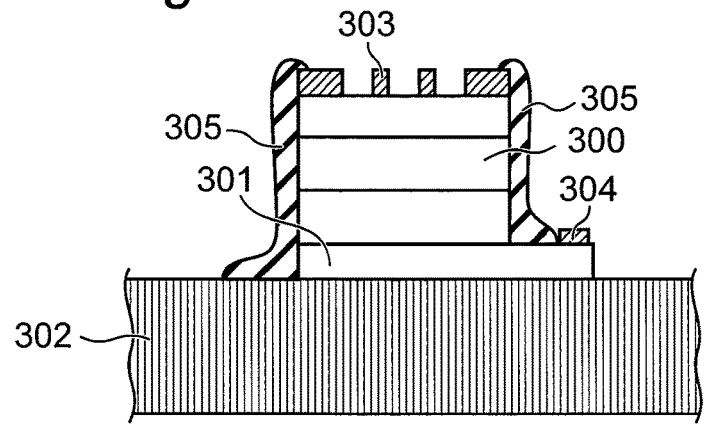
FIG. 3E is a schematic sectional view showing a method of producing the power generating element used in the condensing photoelectric conversion apparatus according to the first embodiment of the present disclosure.

As shown in FIG. 3E, the power generation layer 300 thus patterned is then provided, on its side surfaces, with an insulating protective film 305. For example, the insulating protective film 305 can be a thin film of polyimide, silicone nitride, or silicon oxide.

Figure 3F:
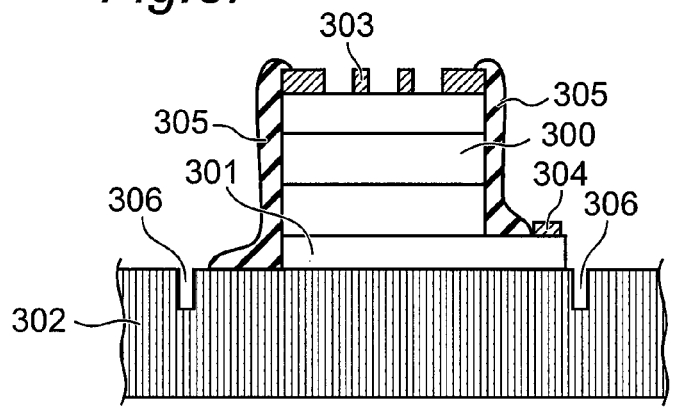
FIG. 3F is a schematic sectional view showing a method of producing the power generating element used in the condensing photoelectric conversion apparatus according to the first embodiment of the present disclosure.

As shown in FIG. 3F, the substrate 302 is then provided with via holes 306. The via hole 306 has a diameter of 50 μm to 150 μm and a depth of 100 μm, for example.

Figure 3G:
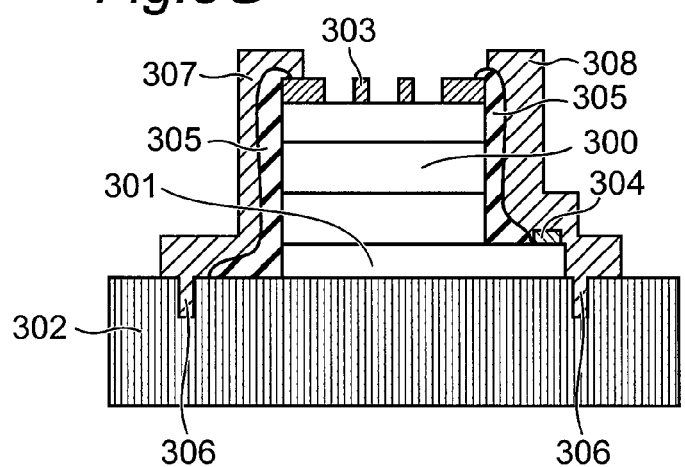
FIG. 3G is a schematic sectional view showing a method of producing the power generating element used in the condensing photoelectric conversion apparatus according to the first embodiment of the present disclosure.

As shown in FIG. 3G, plated electrodes 307 and 308 are formed subsequently. The plated electrodes 307 and 308 fill the via hole 306. The plated electrode 307 is electrically connected to the grid electrode 303, whereas the plated electrode 308 is electrically connected to the electrode 304.

Figure 3H:
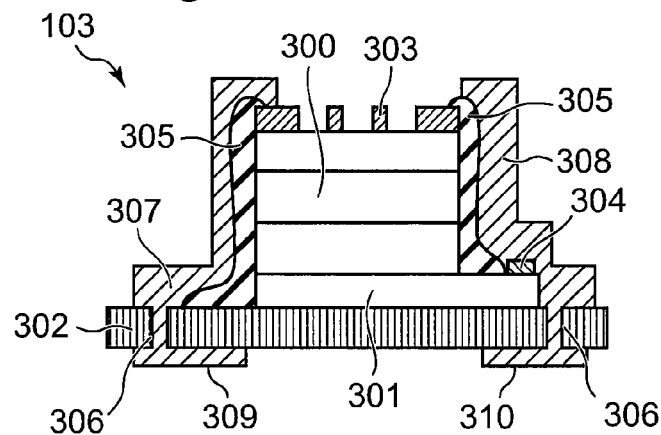
FIG. 3H is a schematic sectional view of a power generating element produced by the method of producing the power generating element used in the condensing photoelectric conversion apparatus according to the first embodiment of the present disclosure.
Figure 3I:
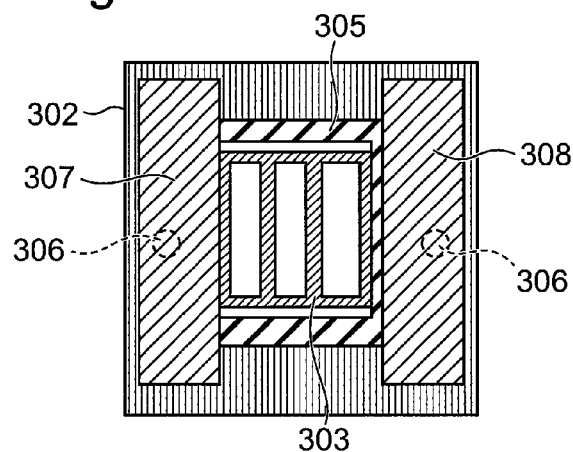
FIG. 3I is a schematic plan view of a power generating element produced by the method of producing the power generating element used in the condensing photoelectric conversion apparatus according to the first embodiment of the present disclosure.

As shown in FIG. 3H, as one example, the rear surface of the semi-insulating substrate 302 is then polished to the thickness of approximately 100 μm, electrodes 309 and 310 are formed on the rear surface, and the substrate 302 is finally diced to obtain the power generating elements 103. As shown in FIG. 3H, the electrode 309 is electrically connected to the plated electrode 307, whereas the electrode 310 is electrically connected to the plated electrode 308. Accordingly, the electrode 309 functions as a negative electrode of the power generating element 103 whereas the electrode 310 functions as a positive electrode of the power generating element 103. FIG. 3I is a schematic plan view of the power generating element 103 viewed from the grid electrode 303.

The power generating element 103 is not limited in size, but can be entirely sized to have a side of 0.3 mm to 1 mm.

Although not shown in FIGS. 1A to 2C, the plurality of condensing photoelectric conversion modules 100 may be electrically joined to each other. In this case, the adjacent circuit boards 105 in the condensing photoelectric conversion apparatus 110 may be electrically connected via an electrically connecting material such as soldering or an anisotropic conductive film.

<Refractive Index of Third Resin 107>

The third resin 107 is configured to have a refractive index $n_1$ satisfying a predetermined relational expression with a refractive index $n_0$ of a material for the lens array 101 in a predetermined wavelength region.

The predetermined wavelength region herein refers to a wavelength defining the color of the second resin 104 used for the condensing photoelectric conversion apparatus 110. In a case where a colored resin as the second resin 104 is yellow, the predetermined wavelength region includes a wavelength of 570 nm to 590 nm defining yellow. In a case where a colored resin as the second resin 104 is red, the predetermined wavelength region includes a wavelength of 620 nm to 750 nm defining red.

The feature that the refractive index $n_1$ of the third resin 107 and the refractive index $n_0$ (of the condensing lens 109) of the lens array 101 satisfy the predetermined relational expression means that the refractive index $n_0$ of the lens array 101 and the refractive index $n_1$ of the third resin 107 satisfy the relation indicated by the following expression (1).

$$n_0 - 0.05 \leq n_1 \leq n_0 + 1.0 \qquad (1)$$

A refractive index varies in accordance with a wavelength. The expression (1) is thus made to be established at each wavelength. When the refractive index $n_0$ of the lens array 101 and the refractive index $n_1$ of the third resin 107 satisfy the expression (1), the condensing photoelectric conversion apparatus 110 according to the first embodiment of the present disclosure appears brighter in color than the conventional condensing photoelectric conversion apparatus. The reasons therefor are to be described later.

A refractive index is a function of a wavelength, and a wavelength region of light used by an ordinary condensing photoelectric conversion apparatus include a wavelength from 400 nm to 1400 nm, for example. An ordinary resin used for a lens, such as polymethyl methacrylate or polycarbonate, has a refractive index of approximately 1.5 to 1.6 in this wavelength region. Ordinary optical glass used for a lens has a refractive index of approximately 1.4 to 1.5 in this wavelength region. An epoxy resin, a silicone resin, an acrylic resin, or a polyolefin resin has a refractive index of approximately 1.5 to 1.6 in this wavelength region. The expression (1) can be satisfied when an appropriate one of the resins mentioned above is selected in accordance with the refractive index of the lens. The expression (1) can be satisfied even when two or more resins mentioned above are mixed.

The third resin 107 may be the same colored resin as the second resin 104.

When the refractive index $n_1$ of the third resin 107 and the refractive index $n_0$ of the condensing lens 109 satisfy the relational expression $n_0 \le n_1 \le n_0 + 1.0$, the outer color is uniform more reliably even at a small observation angle.

Described next with reference to FIGS. 4A to 4E is the principle that the condensing photoelectric conversion apparatus 110 according to the first embodiment of the present disclosure entirely appears uniform in outer color as compared to the conventional condensing photoelectric conversion apparatus.

Figure 4A:
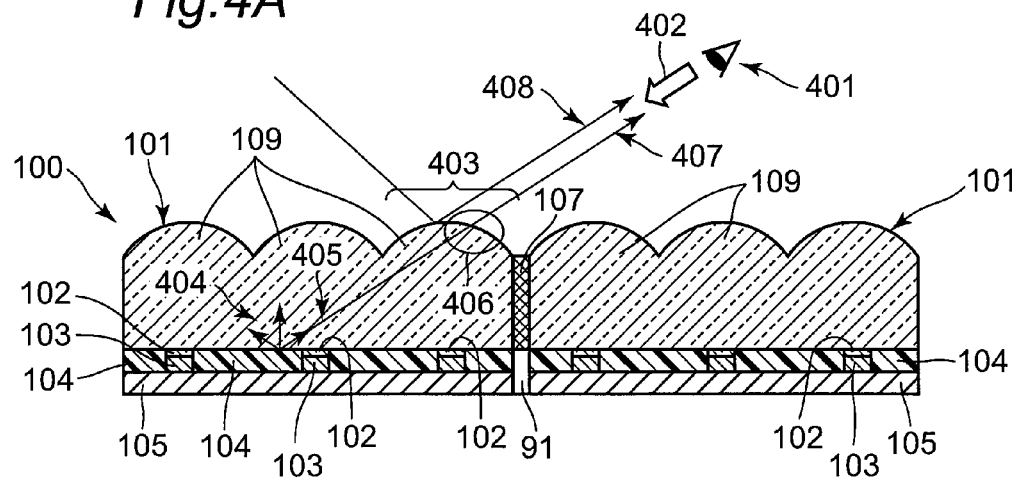
FIG. 4A is a schematic sectional view showing a state of a light ray reaching an observer who observes the condensing photoelectric conversion apparatus according to the first embodiment of the present disclosure.
Figure 4B:
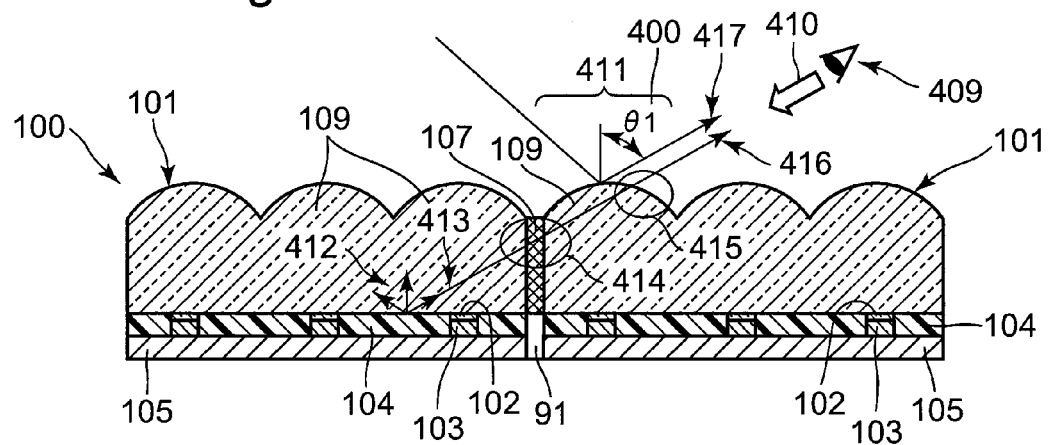
FIG. 4B is a schematic sectional view showing a state of a light ray reaching an observer who observes the condensing photoelectric conversion apparatus according to the first embodiment of the present disclosure.

Similarly to FIGS. 17A and 17B, FIGS. 4A and 4B are schematic sectional views of the condensing photoelectric conversion apparatus 110, illustrating how a color of a vicinity 403 of the lens array 101 of the condensing photoelectric conversion module 100 appears to an observer 401 and how a color of a vicinity 411 of the lens array 101 appears to the observer 409, respectively. FIGS. 4A and 4B do not show the base 106 fixing the condensing photoelectric conversion module 100, and the like. While description is made with reference to these two figures for easier understanding, the observer 401 is actually identical with the observer 409 and this single observer simultaneously observes the vicinity 403 and the vicinity 411 of the lens array 101.

The position and the direction for observation of the condensing photoelectric conversion apparatus 110 in FIGS. 4A and 4B are substantially the same as the position and the direction for observation of the conventional condensing photoelectric conversion apparatus in FIGS. 17A and 17B.

Initially, with reference to FIG. 4A, a case where the observer 401 observes the end 403 of the lens array 101 is described. The end 403 corresponds to the condensing lens 109 closest to the lens array 101 of the adjacent condensing photoelectric conversion module 100, in the lens array 101 of the condensing photoelectric conversion module 100. In other words, the end 403 corresponds to the condensing lens 109 closest to the gap 91 formed between the two adjacent condensing photoelectric conversion modules 100. Scattering light 405 as part of scattering light 404 from the colored second resin 104 travels toward the observer 401. The scattering light 405 traveling toward the observer 401 passes through a region 406 closer to the observer 401 in the end 403 (the vicinity of the interface between air and the condensing lens 109 closest to the lens array 101 of the adjacent condensing photoelectric conversion module 100, in the lens array 101), and reaches the observer 401 as a light ray 407. When the observer 401 observes the light ray 407, the end 403 of the condensing lens 109 appears in the color of the colored second resin 104.

Figure 4C:
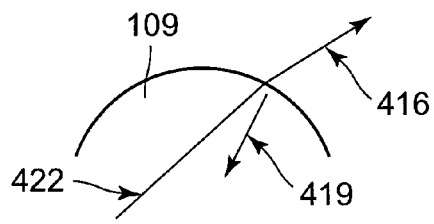
FIG. 4C is an enlarged view of a region 406 in FIG. 4A, showing a state of a light ray reaching an observer who observes the condensing photoelectric conversion apparatus according to the first embodiment of the present disclosure.

FIG. 4C is a schematic view showing a transmission state of the scattering light ray 405 in the region 406. As shown in FIG. 4C, a light ray 418 as part of the scattering light ray 405 is reflected once by the interface between the condensing lens 109 and air so as to enter the condensing lens 109. The light 407 scattering at the colored second resin 104 and reaching the observer 401 has an intensity smaller than that of the light ray in the region 406. Sunlight 408 reflected by the end 403 of the condensing lens 109 also reaches the observer 401. The light ray 408 includes all the wavelengths of sunlight, and thus appears white to the observer 401. The observer 401 simultaneously observes the light ray 407 and the light ray 408. The end 403 of the condensing lens 109 appears, to the observer 401, in a color obtained by mixing the color of the colored second resin 104 by the light ray 407 and white by the light ray 408.

Next, with reference to FIG. 4B, a case is described where the observer 409 observes the end 411 of the condensing lens 109 of the different condensing photoelectric conversion module 100 adjacent to the condensing photoelectric conversion module 100 illustrated in FIG. 4A. The end 411 corresponds to the condensing lens 109 closest to the lens array 101 of the condensing photoelectric conversion module 100 illustrated in FIG. 4A, in the lens array 101 of the different condensing photoelectric conversion module 100 adjacent to the condensing photoelectric conversion module 100 illustrated in FIG. 4A. In other words, the end 411 corresponds to the condensing lens 109 facing the condensing lens 109 illustrated in FIG. 4A, with the gap 91 interposed therebetween.

Similarly to the case of FIG. 4A, scattering light 413 from the colored second resin 104 passes through a region 414 and a region 415, and then reaches the observer 409 as a light ray 416.

Figure 4D:
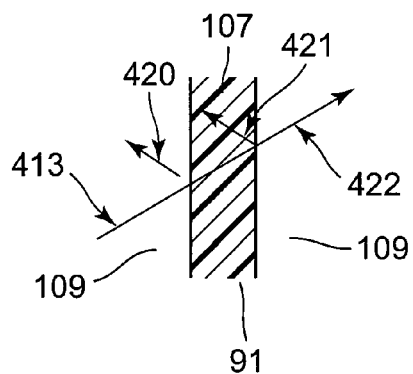
FIG. 4D is an enlarged view of a region 414 in FIG. 4B, showing a state of a light ray reaching an observer who observes the condensing photoelectric conversion apparatus according to the first embodiment of the present disclosure.

FIG. 4D is a schematic view of a transmission state of the light ray 413 in the region 414. The region 414 is a region passing through the third resin 107 provided in the gap 91 between the two adjacent lens arrays 101 facing each other. The gap 91 between the two adjacent lens arrays 101 facing each other is provided with the third resin 107 that has a refractive index satisfying a predetermined relational expression with the refractive index of the lens array 101. The third resin 107 having the refractive index satisfying the predetermined relational expression with the refractive index of the lens array 101 is exemplified by a transparent resin. The scattering light 413 from the second resin 104 passes through the third resin 107 and travels toward the observer 409 as light ray 422. While passing through the third resin 107, a light ray as part of the scattering light ray 413 is reflected by the interface between the condensing lens 109 and the third resin 107. Light 420 and light 421 are reflected light in a case of being incident on the third resin 107 from the adjacent condensing lens 109 and reflected light in a case of being incident on the condensing lens 109 from the third resin 107, respectively.

Figure 4E:
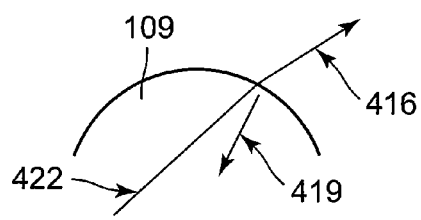
FIG. 4E is an enlarged view of a region 415 in FIG. 4B, showing a state of a light ray reaching an observer who observes the condensing photoelectric conversion apparatus according to the first embodiment of the present disclosure.

FIG. 4E is a schematic view showing a transmission state of the light ray 413 in the region 415. The region 415 corresponds to a region closer to the observer 409 in the end 411 (the vicinity of the interface between air and the condensing lens 109 closest to the lens array 101 of the condensing photoelectric conversion module 100 illustrated in FIG. 4A, in the lens array 101). A light ray 419 as part of the scattering light ray 413 is reflected by the interface between the condensing lens 109 and air. The scattering light 413 is thus reflected by the single interface before reaching the observer 409. The observer 409 also observes sunlight 417 reflected by the end 411 of the condensing lens 109. The observer 409 simultaneously observes the light ray 416 and the light ray 417 to recognize the color of the end 411 of the condensing lens 109.

As the reflected light 420 and the reflected light 421 are weaker, the light ray 416 reaching the observer 409 in FIG. 4B has an intensity closer to the intensity of the light ray 407 reaching the observer 401 in FIG. 4A. Accordingly, the condensing photoelectric conversion apparatus 110 entirely appears uniform in outer color.

Described below is how the outer color of the condensing photoelectric conversion apparatus 110 according to the first embodiment of the present disclosure appears in each of a case where the refractive index of the lens array 101 is equal to the refractive index of the third resin 107 and a case where the refractive index of the lens array 101 is not equal to the refractive index of the third resin 107. When the refractive index of the lens array 101 is equal to the refractive index of the third resin 107, the expression (1) is satisfied. This also includes a case where there is an error such as a production error between these refractive indices. The error such as a production error is in the range of ±0.002, for example.

(1) When Refractive Index of Lens Array 101 is Equal to Refractive Index of Third Resin 107

In this case, the light ray 413 travels toward the observer 409 without being reflected by the interface between the lens array 101 and the third resin 107. The reflected light 420 and the reflected light 421 each have the intensity equal to 0. Accordingly, the condensing photoelectric conversion apparatus 110 entirely appears uniform in outer color.

(2) When Refractive Index of Lens Array 101 is not Equal to Refractive Index of Third Resin 107

As shown in FIG. 4D, the scattering light ray 413 from the second resin 104 is reflected by the interface between the lens array 101 and the third resin 107. The light ray 416 reaching the observer 409 in FIG. 4B has an intensity smaller than the intensity of the light ray 407 reaching the observer 401 in FIG. 4A. The end 411 of the lens array 101 appears differently in outer color from the end 403 of the lens array 101. The entire apparatus thus appears ununiform in outer color.

Figure 5A:
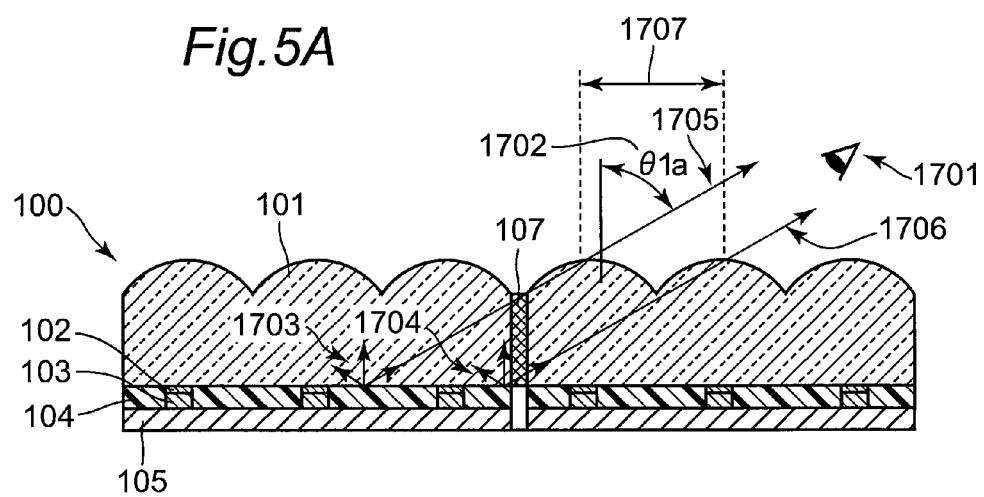
FIG. 5A is a schematic sectional view showing a state where a light ray passing through a third resin in a gap between two adjacent condensing photoelectric conversion modules reaches an observer who observes the condensing photoelectric conversion apparatus according to the first embodiment at a different angle.
Figure 5B:
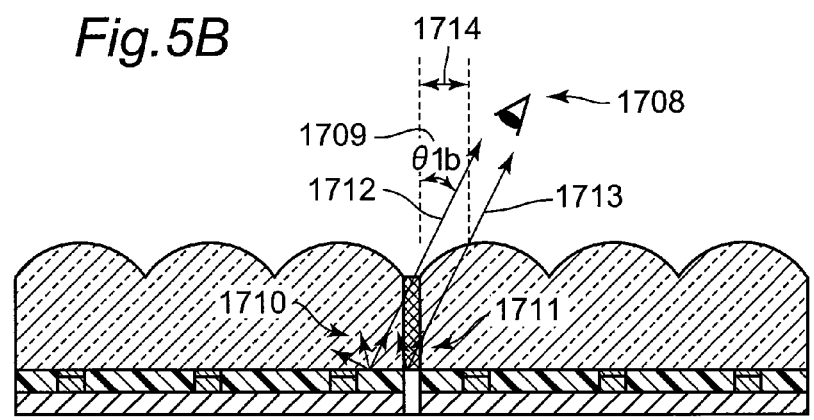
FIG. 5B is a schematic sectional view showing a state where a light ray passing through the third resin in the gap between two adjacent condensing photoelectric conversion modules reaches an observer who observes the condensing photoelectric conversion apparatus according to the first embodiment at a different angle.

FIGS. 5A and 5B are schematic sectional views showing states where a light ray passing through the third resin 107 in the gap 91 between the two adjacent condensing photoelectric conversion modules 100 reaches observers 1701 and 1708 who observe the condensing photoelectric conversion apparatus 110 at different angles, respectively. Assume that an observation angle θ1a from the vertical direction in FIG. 5A is larger than an observation angle θ1b from the vertical direction in FIG. 5B.

As shown in FIG. 5A, scattering light 1703 and scattering light 1704 from the second resin 104 pass through the third resin 107 and reach the observer 1701 as a light ray 1705 and a light ray 1706, respectively. When the light ray 1703 and the light ray 1704 are reflected by the third resin 107, a region 1707 of the condensing lens 109 appears whiter than the remaining region of the condensing lens 109. The remaining region of the condensing lens 109 is not influenced by reflection by the third resin 107 when the observer 1701 distinguishes the color of the condensing lens 109, and corresponds to the end 403 shown in FIG. 4A.

Similarly, as shown in FIG. 5B, scattering light 1710 and scattering light 1711 from the second resin 104 pass through the third resin 107 and reach the observer 1708 as a light ray 1712 and a light ray 1713. When the light ray 1710 and the light ray 1711 are reflected by the third resin 107, a region 1714 of the condensing lens 109 appears whiter than the remaining region of the condensing lens 109.

As is apparent from FIGS. 5A and 5B, the region 1707 is larger in area than the region 1714. In other words, when the observation angle is smaller as in FIG. 5B than the observation angle in FIG. 5A, the smaller area of the condensing lens 109 appears whiter due to reflection by the third resin 107.

The inventors of the present disclosure observed the appearance of the condensing photoelectric conversion apparatus 110 many times to find that the region appearing whiter does not influence the color of the entire condensing photoelectric conversion apparatus 110 if the observation angle is 30 degrees or less.

FIGS. 6A to 8 each show calculation results of a correlation between an observation angle θ1 or θ2 and a relative intensity of light reaching an observer, from each of the condensing photoelectric conversion apparatus 110 according to the first embodiment of the present disclosure (see FIG. 4B) and the conventional condensing photoelectric conversion apparatus (see FIG. 17B). The relative intensity herein is a ratio of an intensity of light reaching the observer and an intensity of scattering light from a coloring agent. The relative intensity in FIG. 4B is a ratio of the intensity of the light ray 416 and the intensity of the light ray 413. The relative intensity in FIG. 17B is a ratio of the intensity of the light ray 1215 and the intensity of the light ray 1212. In these figures, dotted lines indicate calculation results V of the conventional condensing photoelectric conversion apparatus. Solid lines indicate calculation results III, IV, VI, VII, and IX of the condensing photoelectric conversion apparatus 110 according to the first embodiment as well as calculation results I, II, and VIII according to similar comparative examples.

In the calculation, the condensing photoelectric conversion apparatus 110 according to the first embodiment of the present disclosure and the conventional condensing photoelectric conversion apparatus each include a condensing lens made of PMMA. PMMA is assumed to have the refractive index of 1.49. The box 1105 of the conventional condensing photoelectric conversion apparatus is assumed to be also made of PMMA. For simplified calculation, the lens array 101 of the condensing photoelectric conversion apparatus 110 according to the first embodiment of the present disclosure and the lens array 1101 of the conventional condensing photoelectric conversion apparatus are each approximated to have a flat plate shape. Each of the lens array included in the condensing photoelectric conversion apparatus 110 according to the first embodiment of the present disclosure and the lens array used in the conventional condensing photoelectric conversion apparatus does not have a flat plate shape but actually has a convex shape. This approximation does not cause any erroneous comparison result between the relative intensities of these lens arrays. It is also assumed that neither the lens nor the third resin 107 absorbs light.

FIGS. 6A to 6D show calculation results of the case where the third resin 107 has a refractive index smaller than the refractive index of the lens. The entire condensing photoelectric conversion apparatus 110 appears ununiform in outer color at the observation angle of 30 degrees or more. Thus, for easier understanding, these graphs each mark the observation angle of 30 degrees with a vertical broken line.

Figure 6A:
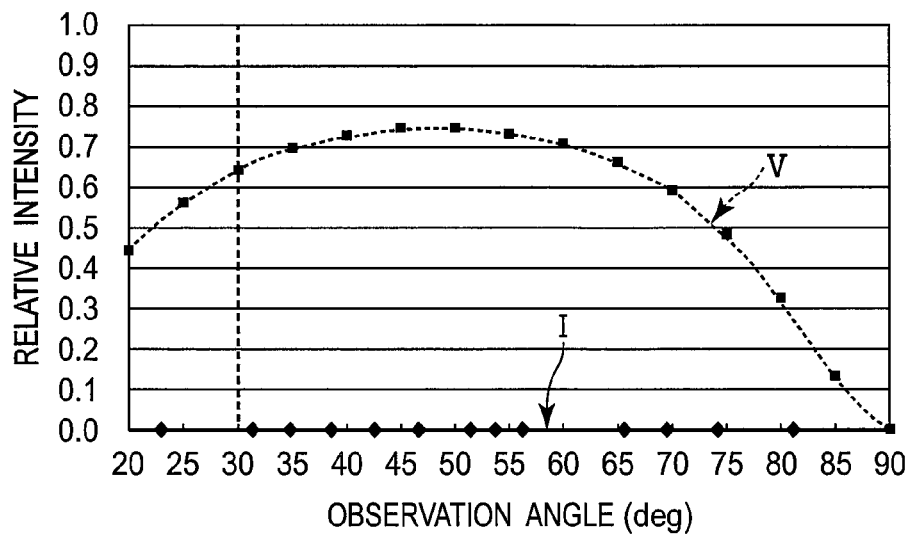
FIG. 6A is a graph indicating calculation results of a correlation between an observation angle and a relative intensity of light reaching an observer, from each of a comparative example of a condensing photoelectric conversion apparatus according to the first embodiment and a conventional condensing photoelectric conversion apparatus, in a case where the refractive index of the third resin is 1.

The solid line in FIG. 6A indicates the calculation result I of the case where the third resin 107 has the refractive index equal to 1. In this case, not the third resin 107 but an air layer is provided in the gap 91 in the condensing photoelectric conversion apparatus 110 according to the first embodiment of the present disclosure. The relative intensity is 0 in this case, and the scattering light 413 from the third resin 107 does not reach the observer 409. The reasons therefor are described below.

When the light ray 413 is incident on the interface between the lens array 101 and the third resin 107 at an incident angle of 45 degrees or more, the light ray 413 is entirely reflected by the interface. A light ray having an incident angle of 0 degrees to 45 degrees thus passes through the third resin 107. The light ray 422 having passed through the third resin 107 is incident on the interface between the lens array 101 and air. The incident angle is from 45 degrees to 90 degrees in this case. The light ray 422 at such an angle is entirely reflected by the interface between the lens array 101 and air. If the third resin 107 is not provided, the scattering light 413 does not reach the observer 409.

Figure 6B:
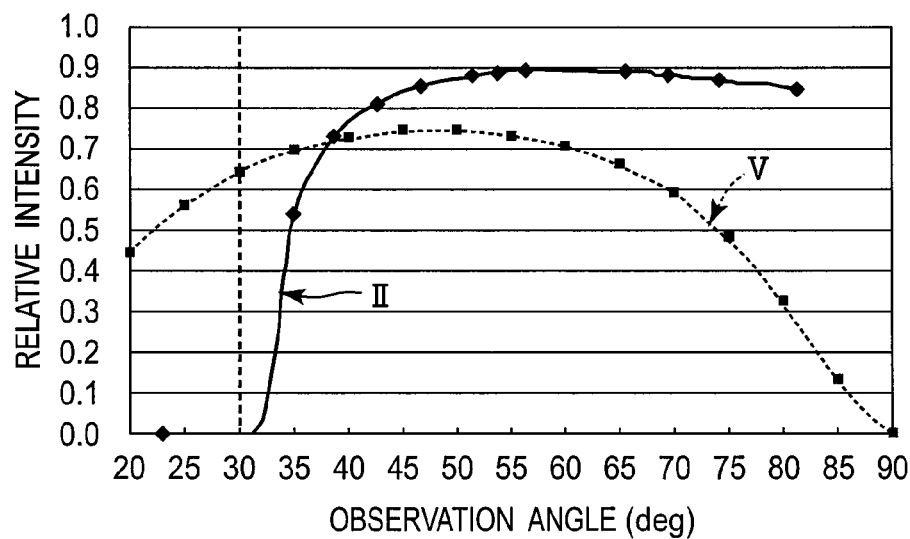
FIG. 6B is a graph indicating calculation results of a correlation between an observation angle and a relative intensity of light reaching an observer, from each of a comparative example of a condensing photoelectric conversion apparatus according to the first embodiment and a conventional condensing photoelectric conversion apparatus, in a case where the refractive index of the third resin is 1.40.
Figure 6C:
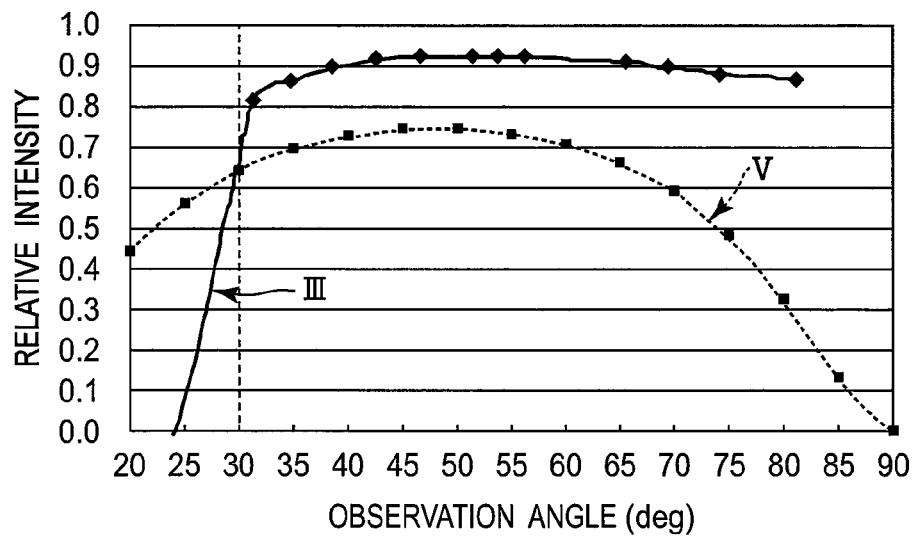
FIG. 6C is a graph indicating calculation results of a correlation between an observation angle and a relative intensity of light reaching an observer, from each of the condensing photoelectric conversion apparatus according to the first embodiment and the conventional condensing photoelectric conversion apparatus, in a case where the refractive index of the third resin is 1.44.
Figure 6D:
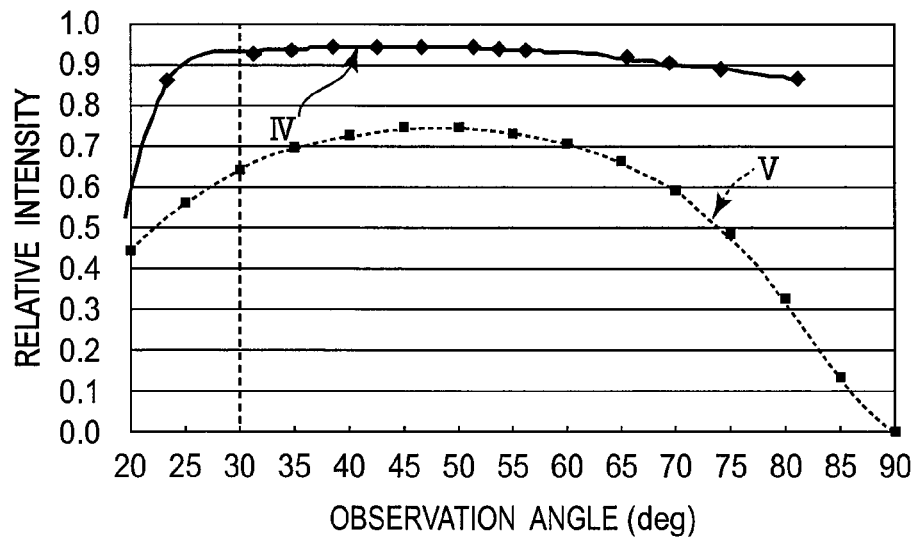
FIG. 6D is a graph indicating calculation results of a correlation between an observation angle and a relative intensity of light reaching an observer, from each of the condensing photoelectric conversion apparatus according to the first embodiment and the conventional condensing photoelectric conversion apparatus, in a case where the refractive index of the third resin is 1.47.

FIGS. 6B to 6D show, by solid lines, calculation results II, III, and IV of the case where the third resin 107 has the refractive indices of 1.40, 1.44, and 1.47, respectively. In other words, FIG. 6B shows calculation results for the condensing photoelectric conversion apparatus 110 according to a comparative example of the first embodiment of the present disclosure (where only the refractive index of the third resin 107 is different from that in the first embodiment). FIGS. 6C and 6D show calculation results for the condensing photoelectric conversion apparatus 110 according to the first embodiment of the present disclosure. As is apparent from these figures, when the third resin 107 has a refractive index of 1.44 or more (as in FIGS. 6C and 6D) and the observation angle is 30 degrees or more, the relative intensity of the condensing photoelectric conversion apparatus 110 according to the first embodiment of the present disclosure is larger than the relative intensity of the conventional condensing photoelectric conversion apparatus. The third resin 107 is thus assumed to have a refractive index of 1.44 or more, for example. The refractive index of the lens is assumed to be 1.49 in the calculation. The relative intensity of the condensing photoelectric conversion apparatus 110 according to the first embodiment of the present disclosure can be made larger than the relative intensity of the conventional condensing photoelectric conversion apparatus when the refractive index of the lens is from 1.4 to 1.6 and the refractive index of the lens is also different from the refractive index of the third resin 107 by 0.05 or less.

Figure 7A:
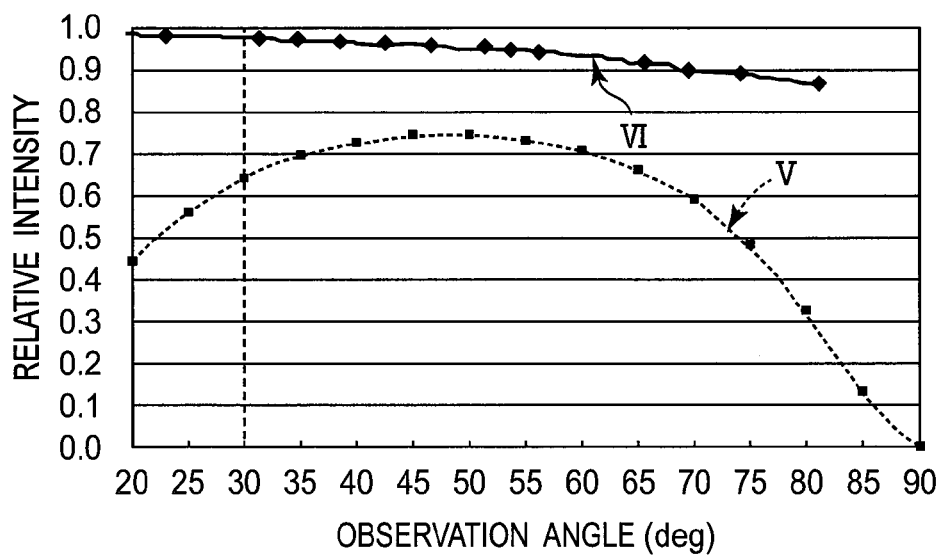
FIG. 7A is a graph indicating calculation results of a correlation between an observation angle and a relative intensity of light reaching an observer, from each of the condensing photoelectric conversion apparatus according to the first embodiment and the conventional condensing photoelectric conversion apparatus, in a case where the refractive index of the third resin is 1.56 that is larger than the refractive index of the lens.
Figure 7B:
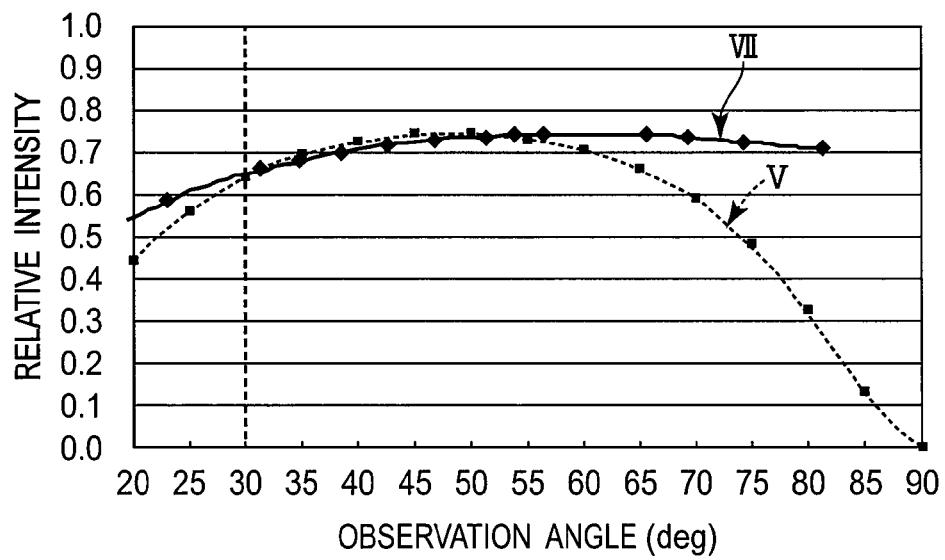
FIG. 7B is a graph indicating calculation results of a correlation between an observation angle and a relative intensity of light reaching an observer, from each of the condensing photoelectric conversion apparatus according to the first embodiment and the conventional condensing photoelectric conversion apparatus, in a case where the refractive index of the third resin is 2.49 that is larger than the refractive index of the lens.
Figure 7C:
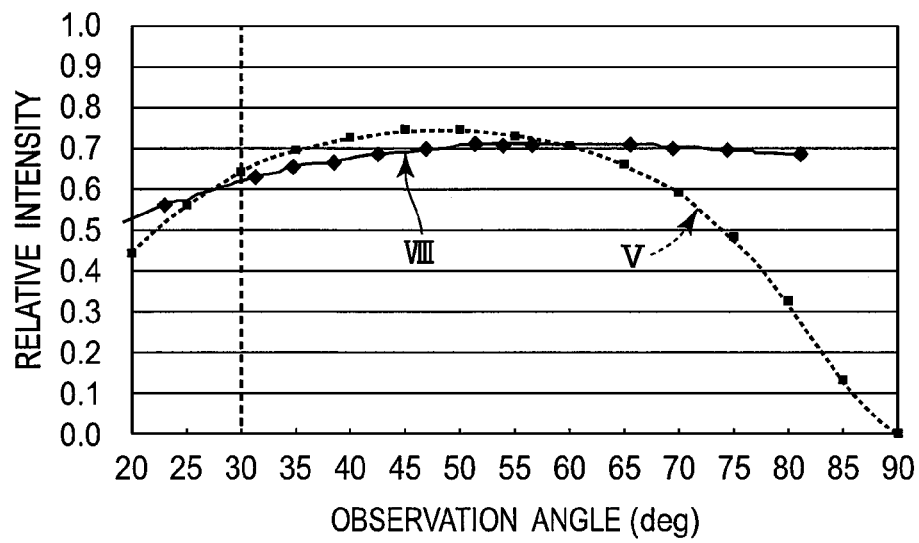
FIG. 7C is a graph indicating calculation results of a correlation between an observation angle and a relative intensity of light reaching an observer, from each of the comparative example of the condensing photoelectric conversion apparatus according to the first embodiment and the conventional condensing photoelectric conversion apparatus, in a case where the refractive index of the third resin is 2.69 that is larger than the refractive index of the lens.

FIGS. 7A to 7C show calculation results VI, VII, and VIII of the case where the refractive index of the third resin 107 is larger than the refractive index of the lens, and where the refractive indices of the third resin 107 are 1.56, 2.49, and 2.69, respectively. As is apparent from FIGS. 7A to 7C, when the third resin 107 has a refractive index of 2.49 or less and the observation angle θ1 or θ2 is 30 degrees or more, the relative intensity of the condensing photoelectric conversion apparatus 110 according to the first embodiment of the present disclosure is larger than the relative intensity of the conventional condensing photoelectric conversion apparatus. That is, the difference between the refractive index of the third resin 107 and the refractive index of the lens has only to be 1 or less. The refractive index of the lens is assumed to be 1.49 in the calculation. The relative intensity of the condensing photoelectric conversion apparatus 110 according to the first embodiment of the present invention can be made larger than the relative intensity of the conventional condensing photoelectric conversion apparatus when the refractive index of the lens is from 1.4 to 1.6 and the refractive index of the lens is also different from the refractive index of the third resin 107 by 1 or less.

Figure 8:
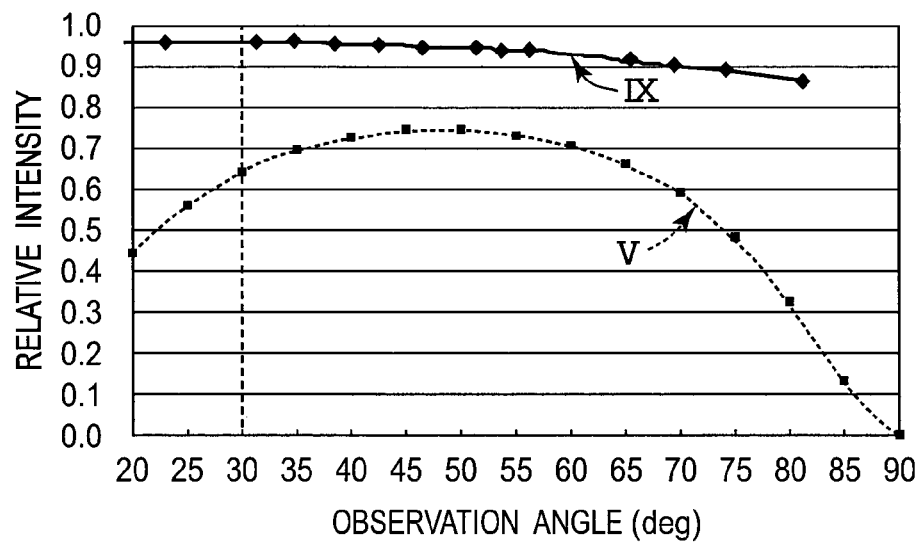
FIG. 8 is a graph indicating calculation results of a correlation between an observation angle and a relative intensity of light reaching an observer, from each of the condensing photoelectric conversion apparatus according to the first embodiment and the conventional condensing photoelectric conversion apparatus, in a case where the refractive index of the lens is equal to the refractive index of the third resin.

FIG. 8 shows a linear calculation result IX of the case where the refractive index of the lens is equal to the refractive index of the third resin 107. As is apparent from FIG. 8, the relative intensity of the condensing photoelectric conversion apparatus 110 according to the first embodiment of the present invention is larger than the relative intensity of the conventional condensing photoelectric conversion apparatus at any observation angle. That is, when the refractive index of the third resin 107 is made equal to the refractive index of the lens, the condensing photoelectric conversion apparatus 110 according to the first embodiment entirely appears more uniform in outer color than the conventional condensing photoelectric conversion apparatus.

FIGS. 4A and 4B show only the case where two positions of the lens array 101 are observed in a specific direction. Even in a case where a different lens is observed in a different direction, the number of interfaces reflecting scattering light is also less than that of the conventional condensing photoelectric conversion apparatus. Thus, even in a case where any lens 109 is observed at any angle, the condensing photoelectric conversion apparatus 110 according to the first embodiment appears more uniform in outer color than the conventional condensing photoelectric conversion apparatus.

When a luminous agent is mixed into the colored second resin 104, the luminous agent absorbs scattering light entering the lens array 101 during daytime and radiates phosphorescence at night. The condensing photoelectric conversion apparatus 110 containing the luminous agent according to the first embodiment can be thus used for an advertisement sign or decoration at night even at a location with no street lamp.

When the third resin 107 is made of a material for the second resin 104, scattering light from the third resin 107 also reaches an observer. The condensing photoelectric conversion apparatus 110 thus appears more uniform in outer color.

According to the first embodiment, the third resin 107 having a refractive index satisfying the predetermined relational expression (1) with the refractive index of the condensing lens 109 is provided between the adjacent lens arrays 101. Such a configuration allows scattering light exiting from the colored second resin 104 to efficiently reach the observer. Accordingly, the end of the condensing photoelectric conversion module 100 in the condensing photoelectric conversion apparatus 110 and the system 111 hardly appears whiter than the remaining portion. The outer color of the condensing photoelectric conversion apparatus 110 can be thus made substantially the same as the color of the colored second resin 104 provided in the condensing photoelectric conversion module 100, and the outer color of the entire apparatus can be made uniform. The condensing photoelectric conversion apparatus 110 and the system 111 can be designed in any color depending on the purpose of use, and can be applied to an advertisement sign or decoration.

Second Embodiment

A condensing photoelectric conversion apparatus 510 according to the second embodiment of the present disclosure is configured identically with the condensing photoelectric conversion apparatus 110 according to the first embodiment except for the following differences. These apparatuses are different in the structure of a power generating element 503, how the power generating element 503 and an external electrode are connected, and a method of fixing a plurality of condensing photoelectric conversion modules 500.

Figure 9A:
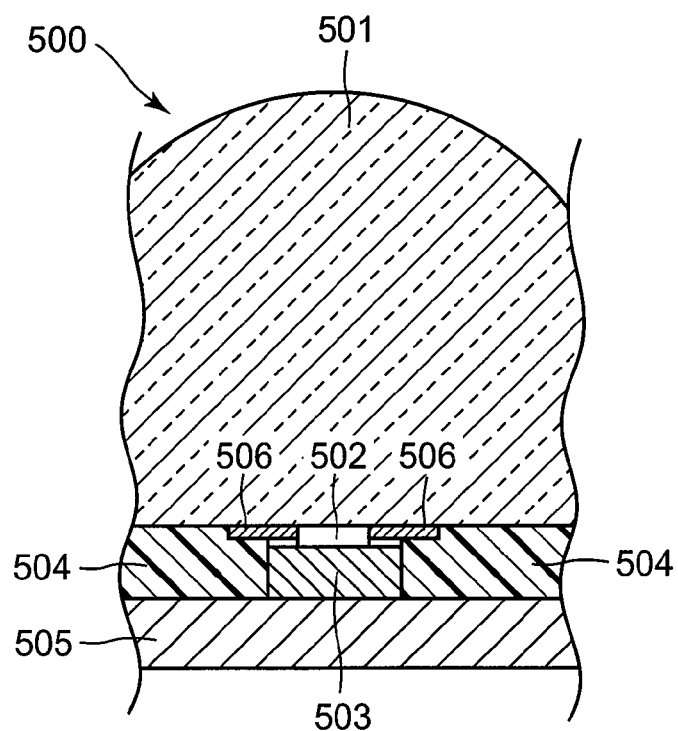
FIG. 9A is a schematic enlarged sectional view of the vicinity of one of condensing lenses in a condensing photoelectric conversion apparatus according to a second embodiment of the present disclosure.
Figure 9B:
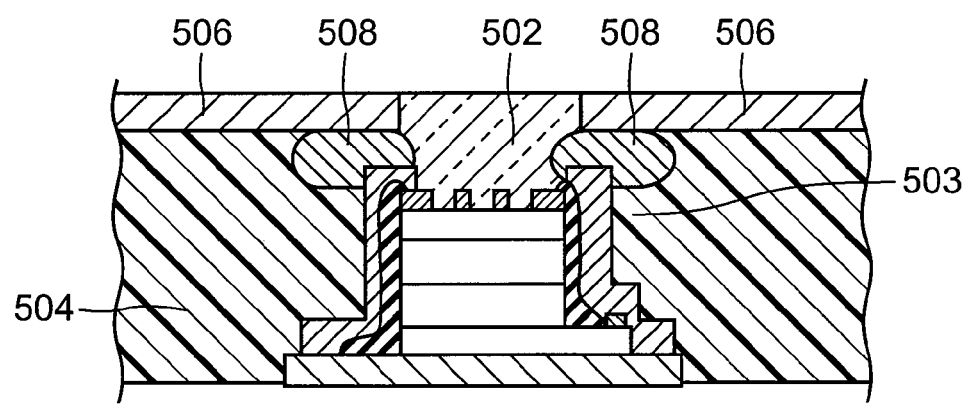
FIG. 9B is a schematic sectional view of a condensing photoelectric conversion module in the vicinity of a power generating element in the condensing photoelectric conversion apparatus according to the second embodiment of the present disclosure.
Figure 9C:
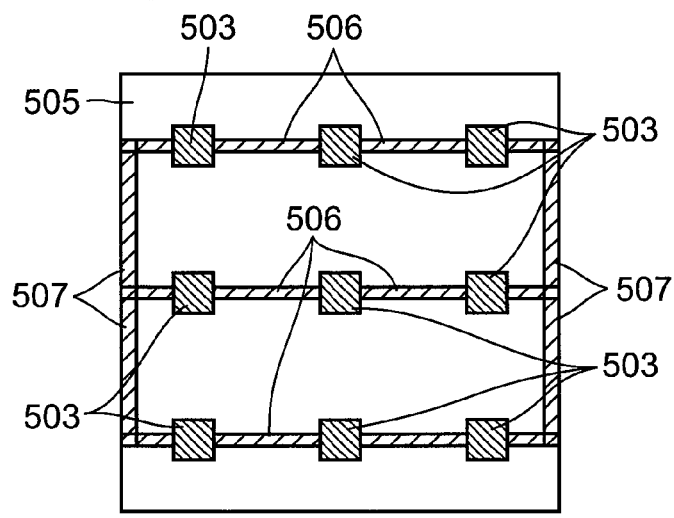
FIG. 9C is a schematic plan view of the condensing photoelectric conversion module in the condensing photoelectric conversion apparatus according to the second embodiment of the present disclosure, in a case where a substrate is removed virtually.

FIGS. 9A to 9C are schematic views of the condensing photoelectric conversion module 500 according to the second embodiment. The condensing photoelectric conversion module 500 according to the second embodiment includes a lens array shaped identically to the lens array according to the first embodiment.

FIG. 9A is a schematic sectional view of the vicinity of one of condensing lenses 501 in the condensing photoelectric conversion module 500 according to the second embodiment. The power generating element 503 is fixed to a flat rear surface of the condensing lens 501 via a transparent first resin 502. The flat rear surface of the condensing lens 501 is provided with a colored second resin 504 except for the region of the transparent first resin 502. The colored second resin 504 and the power generating element 503 are in contact with a substrate 505.

FIG. 9B is a schematic sectional view of the condensing photoelectric conversion module 500 in the vicinity of the power generating element 503. The power generating element 503 has an electrode electrically connected, by a solder paste 508, to an electrode 506 formed on the condensing lens 501.

FIG. 9C is a schematic plan view of the condensing photoelectric conversion module 500 viewed from the flat surface of the lens array, in a case where the substrate 505 is removed virtually. The nine power generating elements 503 in total are disposed in three rows and three columns. The power generating elements 503 in the first to third rows are electrically connected in series by the electrodes 506, respectively. The power generating elements 503 connected in series in the first to third rows are connected in parallel by electrodes 507. As shown in FIG. 9C, the electrodes 506 and 507 are provided on the flat surface of the lens array.

FIGS. 10A to 10F, FIG. 10G, and FIG. 10H are schematic sectional views showing a method of producing the power generating element 503 according to the second embodiment, a schematic sectional view of the power generating element 503 thus produced, and a schematic plan view thereof, respectively.

Figure 10A:
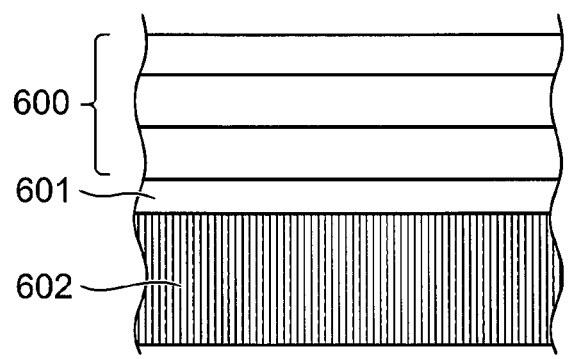
FIG. 10A is a schematic sectional view showing a method of producing the power generating element used in the condensing photoelectric conversion apparatus according to the second embodiment of the present disclosure.

As shown in FIG. 10A, a junction layer 601 of low resistance and a power generation layer 600 are formed on a semi-insulating substrate 602 of 4 inches to 6 inches, for example. The semi-insulating substrate is exemplified by a GaAs substrate. The junction layer 601 of low resistance is exemplified by a highly doped GaAs layer. The power generation layer 600 is exemplified by a GaAs-based thin film including three stacked PN junction layers. The power generation layer 600 is configured to allow photoelectric current to flow from the power generation layer 600 to the substrate 602. Although not shown in FIG. 10A, the power generation layer 600 is provided, at its upper most portion, with a highly doped junction layer. Subsequent FIGS. 10B to 10G show only the method of producing the single power generating element 503. Actually, a large number of power generating elements 503 provided on a wafer and each having a shape same as that of the single power generating element 503 is formed at constant intervals.

Figure 10B:
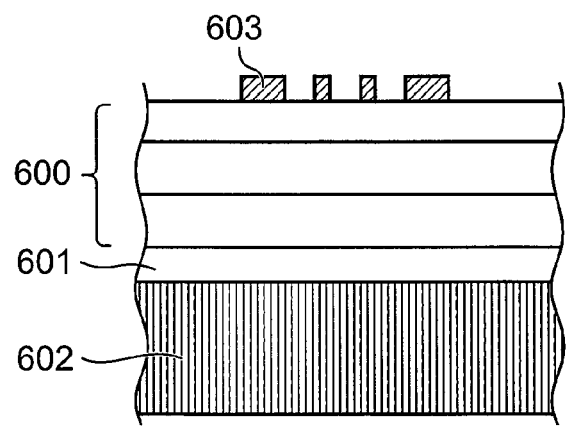
FIG. 10B is a schematic sectional view showing a method of producing the power generating element used in the condensing photoelectric conversion apparatus according to the second embodiment of the present disclosure.

As shown in FIG. 10B, the power generation layer 600 is provided, at its uppermost portion, with grid electrodes 603.

Figure 10C:
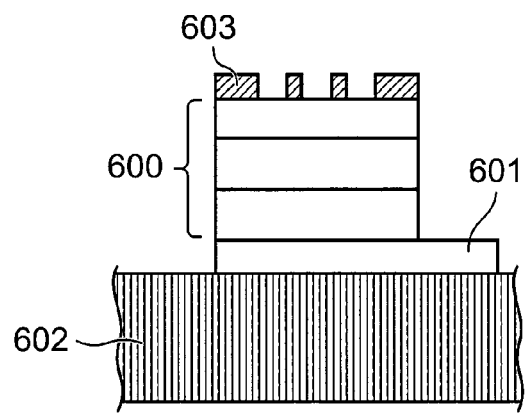
FIG. 10C is a schematic sectional view showing a method of producing the power generating element used in the condensing photoelectric conversion apparatus according to the second embodiment of the present disclosure.

As shown in FIG. 10C, the power generation layer 600 and the junction layer 601 are patterned subsequently.

Figure 10D:
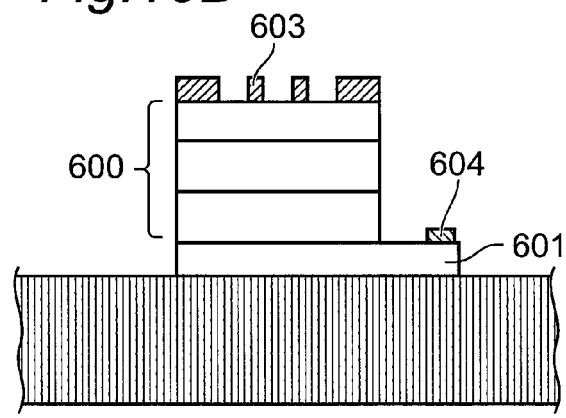
FIG. 10D is a schematic sectional view showing a method of producing the power generating element used in the condensing photoelectric conversion apparatus according to the second embodiment of the present disclosure.

Then, as shown in FIG. 10D, an electrode 604 is then formed on the junction layer 601.

Figure 10E:
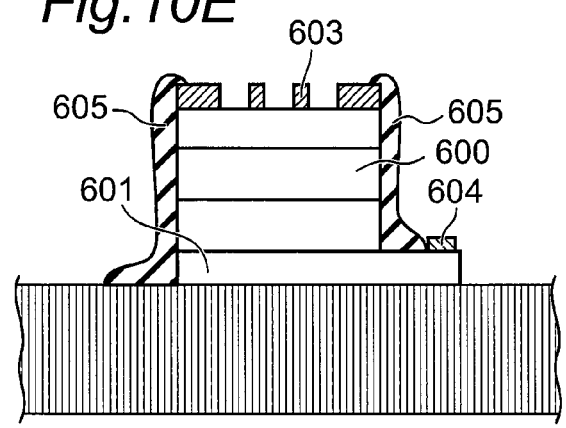
FIG. 10E is a schematic sectional view showing a method of producing the power generating element used in the condensing photoelectric conversion apparatus according to the second embodiment of the present disclosure.

As shown in FIG. 10E, the power generation layer 600 thus patterned is then provided, on its side surfaces, with an insulating protective film 605. For example, the insulating protective film 605 can be a thin film of polyimide, silicone nitride, silicon oxide, or the like.

Figure 10F:
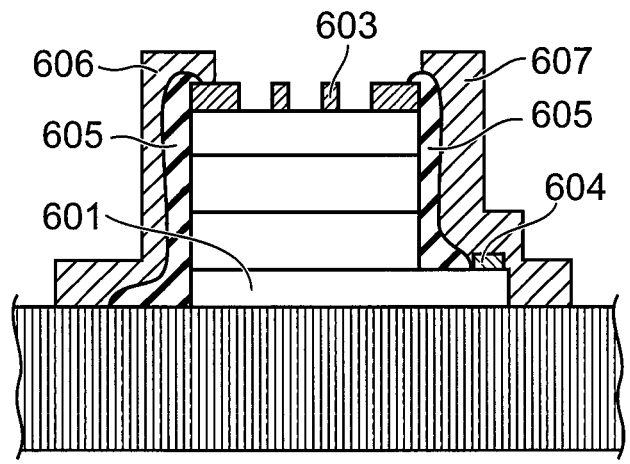
FIG. 10F is a schematic sectional view showing a method of producing the power generating element used in the condensing photoelectric conversion apparatus according to the second embodiment of the present disclosure.

As shown in FIG. 10F, plated electrodes 606 and 607 are formed subsequently. The plated electrode 606 is electrically connected to the grid electrodes 603, whereas the plated electrode 607 is electrically connected to the electrode 604.

Figure 10G:
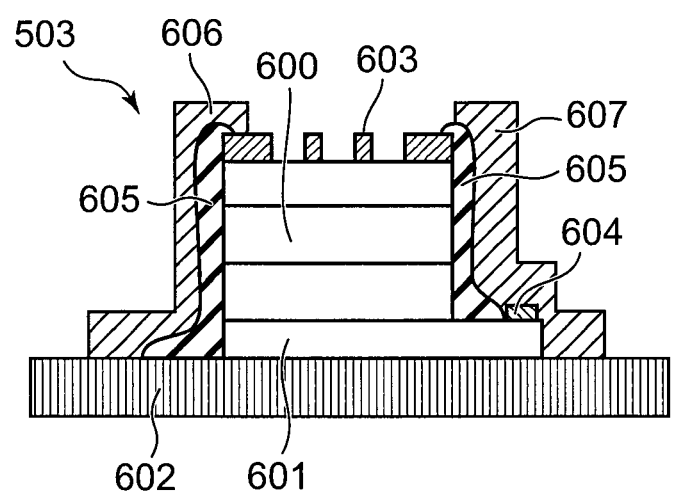
FIG. 10G is a schematic sectional view of a power generating element produced by the method of producing the power generating element used in the condensing photoelectric conversion apparatus according to the second embodiment of the present disclosure.
Figure 10H:
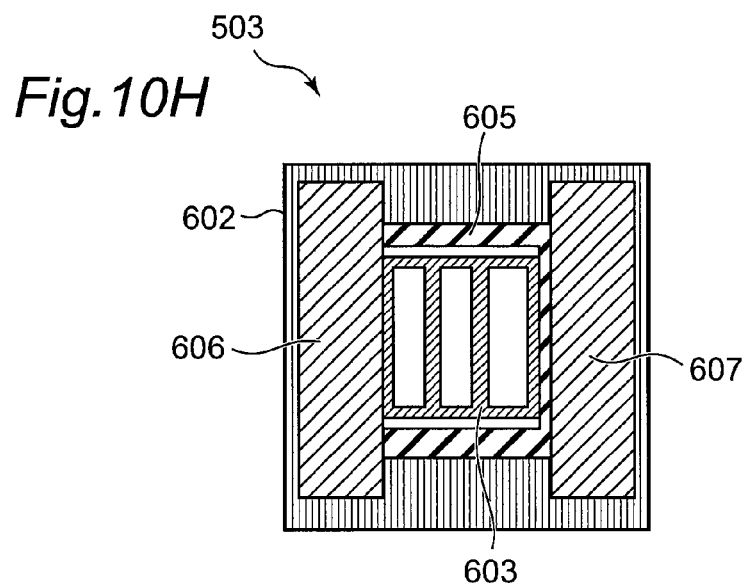
FIG. 10H is a schematic plan view of a power generating element produced by the method of producing the power generating element used in the condensing photoelectric conversion apparatus according to the second embodiment of the present disclosure.

As shown in FIG. 10G, the rear surface of the semi-insulating substrate 602 is then polished to the thickness of approximately 100 μm and the substrate 602 is diced to obtain the power generating elements 503. As shown in FIG. 10G, the plated electrode 606 functions as a negative electrode of the power generating element 503 whereas the plated electrode 607 functions as a positive electrode of the power generating element 503. FIG. 10H is a schematic plan view of the power generating element 503 viewed from the grid electrodes 603.

The power generating element 503 is not limited in size, but can be entirely sized to have a side of 0.3 mm to 1 mm, for example.

Figure 11A:
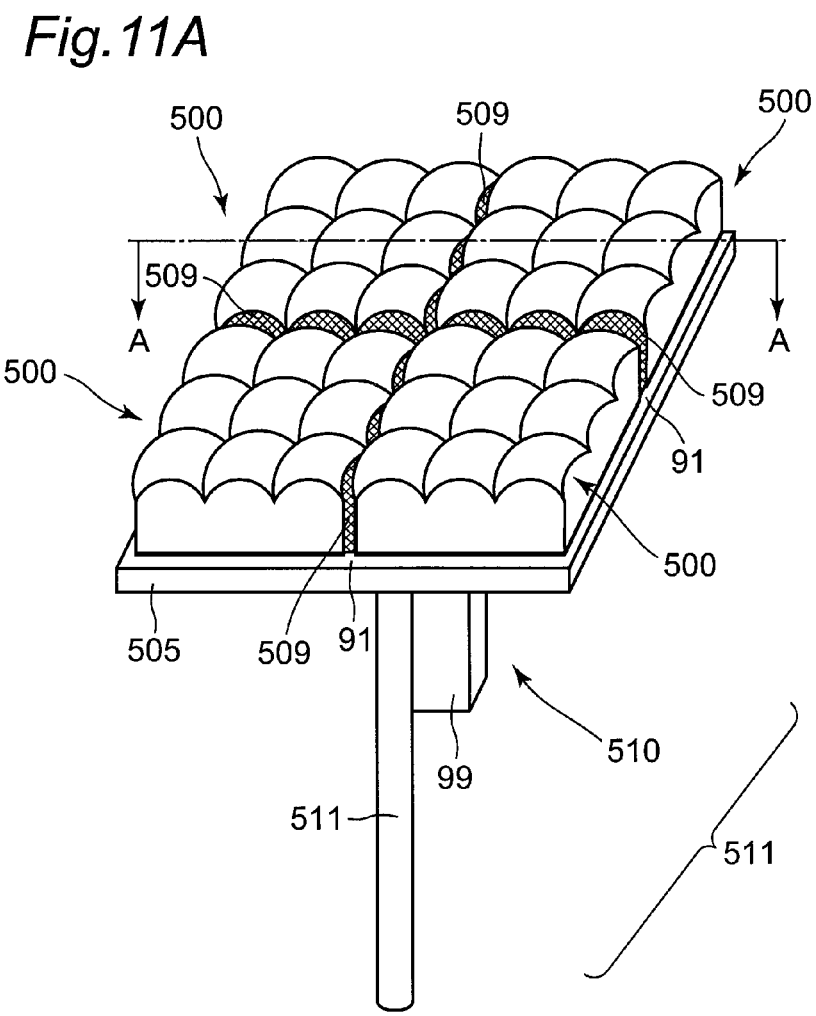
FIG. 11A is a schematic perspective view of the condensing photoelectric conversion apparatus according to the second embodiment of the present disclosure.
Figure 11B:
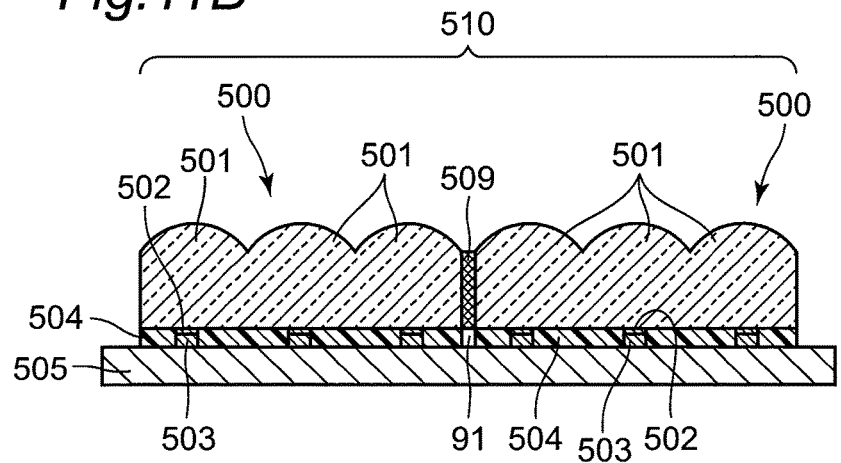
FIG. 11B is a schematic sectional view taken along line A-A in FIG. 11A, of the condensing photoelectric conversion apparatus according to the second embodiment of the present disclosure.

FIGS. 11A and 11B are schematic views of the condensing photoelectric conversion apparatus 510 and a condensing photoelectric conversion system 511 according to the second embodiment.

FIG. 11A is a schematic perspective view of the condensing photoelectric conversion system 511. The condensing photoelectric conversion system 511 includes the condensing photoelectric conversion apparatus 510, a pillar 511 supporting a base 505 of the condensing photoelectric conversion apparatus 510, and the drive unit 99 configured to move the condensing photoelectric conversion apparatus 510 relatively to the pillar 511. The condensing photoelectric conversion apparatus 510 includes a plurality of condensing photoelectric conversion modules 500 disposed two-dimensionally and the base 505 supporting the plurality of condensing photoelectric conversion modules 500. FIG. 11B is a schematic sectional view taken along line A-A, of the condensing photoelectric conversion apparatus 510.

As shown in these figures, in the condensing photoelectric conversion apparatus 510 according to the second embodiment, the base 505 is provided as the substrate 505, which fixes the four condensing photoelectric conversion modules 500 and is in contact with the power generating elements 503 and the colored second resin 504.

The condensing photoelectric conversion apparatus 510 according to the second embodiment does not require the circuit board 105 that is included in the condensing photoelectric conversion apparatus 110 according to the first embodiment. This reduces the cost for its production material. The condensing photoelectric conversion apparatus 510 is also reduced in weight by the weight of the circuit board 105 not included therein.

Third Embodiment

A condensing photoelectric conversion apparatus 900 according to the third embodiment is configured identically with the condensing photoelectric conversion apparatus 110 according to the first embodiment except for the following difference. These apparatuses are different in that a silicone oil 901 is in contact with the third resin 107.

The condensing photoelectric conversion apparatus 900 according to the third embodiment is less changed in color even if the condensing photoelectric conversion apparatus 900 is placed outdoors for a long period of time, as compared to the condensing photoelectric conversion apparatus 110 according to the first embodiment. The features of the condensing photoelectric conversion apparatus 900 according to the third embodiment are described below with reference to FIGS. 12A to 13B.

Figure 12A:
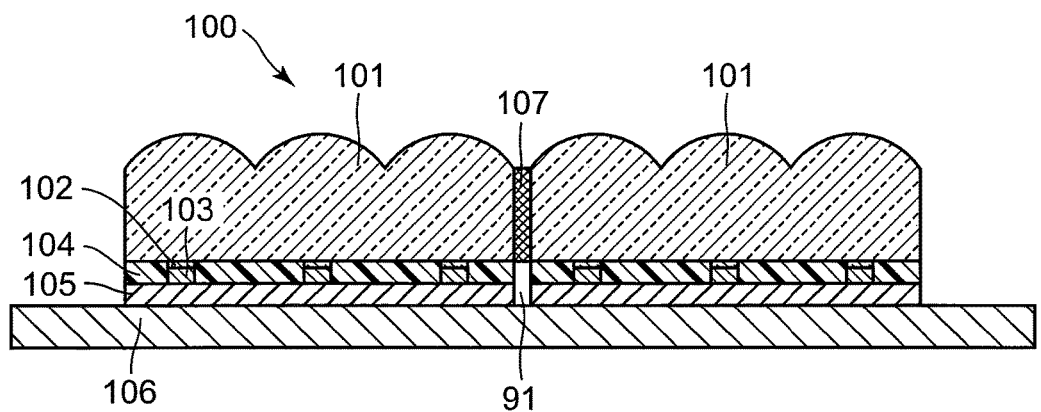
FIG. 12A is a schematic sectional view showing a state before deterioration, of a condensing photoelectric conversion apparatus according to a third embodiment of the present disclosure.
Figure 12B:
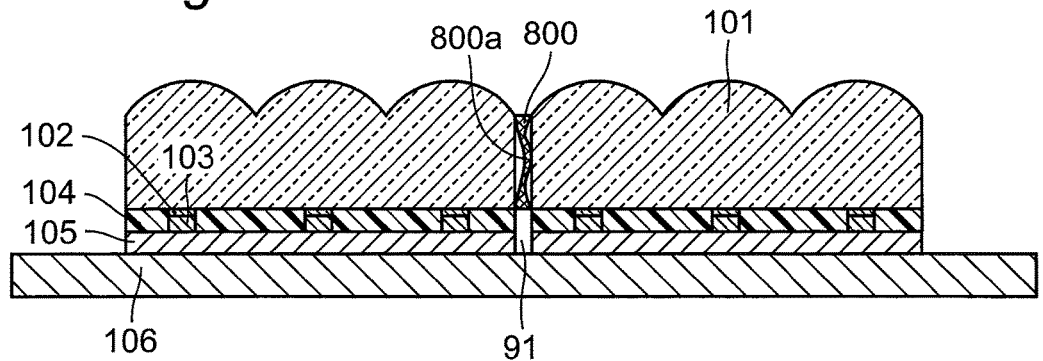
FIG. 12B is a schematic sectional view showing a state after deterioration, of the condensing photoelectric conversion apparatus according to the third embodiment of the present disclosure.

FIGS. 12A and 12B are schematic sectional views of the condensing photoelectric conversion apparatus 110 according to the first embodiment. FIG. 12A shows a state of the condensing photoelectric conversion apparatus 110 before being placed outdoors, whereas FIG. 12B shows a state of the condensing photoelectric conversion apparatus 110 after being placed outdoors for a long period of time. As shown in FIG. 12B, when the condensing photoelectric conversion module 100 is placed outdoors for a long period of time, the third resin 107 may be deteriorated by ultraviolet rays. FIG. 12B schematically shows a third resin 800 that is deteriorated by ultraviolet rays. Generally, when a resin is deteriorated, coupling between molecules of a polymer compound constituting the resin is cut or a functional group is oxidized to be changed into a different functional group. The resin is thus reduced in density, has a crack or a cavity, or is contracted. When light passes through a region with the crack or the cavity, the light is scattered or reflected by this region. As shown in FIG. 12B, when the third resin 107 is contracted, the deteriorated third resin 800 between the adjacent lens arrays 101 has a space 800a. When the condensing photoelectric conversion apparatus 900 is observed in the same manner as in FIG. 4B, the scattering light 416 reaching the observer 409 has an intensity smaller than that of the condensing photoelectric conversion apparatus 110 before being placed outdoors. Thus, the condensing photoelectric conversion apparatus 110 having been placed outdoors for a long period of time appears whiter than the initial condensing photoelectric conversion apparatus 110.

FIGS. 13A and 13B are schematic sectional views of the condensing photoelectric conversion apparatus 900 according to the third embodiment. FIG. 13A is a schematic sectional view of the condensing photoelectric conversion apparatus 900 before being placed outdoors. FIG. 13B is a schematic sectional view of the condensing photoelectric conversion apparatus 900 after being placed outdoors for a long period of time.

The condensing photoelectric conversion apparatus 900 is different from the condensing photoelectric conversion apparatus 110 according to the first embodiment in that the transparent silicone oil 901 is provided below the transparent third resin 107 and in contact with the third resin 107.

As shown in FIG. 13A, the silicone oil 901 is in contact with the third resin 107. As shown in FIG. 13B, when the third resin 107 is deteriorated into a third resin 902, the silicone oil 901 enters the crack or the cavity in a gap of the third resin 902, or a gap between the third resin 902 and the lens array 101 due to surface tension.

When it is assumed that the lens array 101 has a refractive index $n_0$ and the silicone oil 901 has a refractive index $n_2$, when the refractive index $n_0$ of the lens array 101 is equal to the refractive index $n_2$ of the silicone oil 901 or when the refractive indices $n_0$ and $n_2$ are not equal to each other but satisfy the expression (2), similarly to the first embodiment, the condensing photoelectric conversion apparatus 900 has substantially no change in color due to scattering light from the colored second resin 104. Thus, the condensing photoelectric conversion apparatus 900 according to the third embodiment does not appear pale in color even if the condensing photoelectric conversion apparatus 900 is exposed outdoors for a long period of time. The silicone oil 901 enters the gap or the like in the third resin 902 to fill the gap or the like in the third resin 902. This configuration can prevent decrease in uniformity of the outer color due to the gap or the like formed by deterioration of the third resin 902.

$$n_0-0.05 \leq n_2 \leq n_0+1.0 \qquad (2)$$

There are various types of silicone oils 901, and a silicone-based oil of any type is applicable. Among these, an applicable silicone oil can have a high boiling point, for example. For example, silicone oils KF-54, KF-965, and KF-968 (product names) manufactured by Shin-Etsu Chemical Co., Ltd. are applicable.

A fluorine-modified silicone oil obtained by adding a fluorine atom to a silicone oil has surface tension smaller than that of a silicone oil having no fluorine atom. The fluorine-modified silicone oil thus more reliably enters the cavity, the crack in the deteriorated third resin 902 or the gap between the third resin 107 and the lens array 101. The fluorine-modified silicone oil can be exemplified by the oil FL-100 (product name) manufactured by Shin-Etsu Chemical Co., Ltd.

FIGS. 14A to 14F are schematic views showing a method of producing the condensing photoelectric conversion apparatus 900 according to the third embodiment.

Figure 14A:
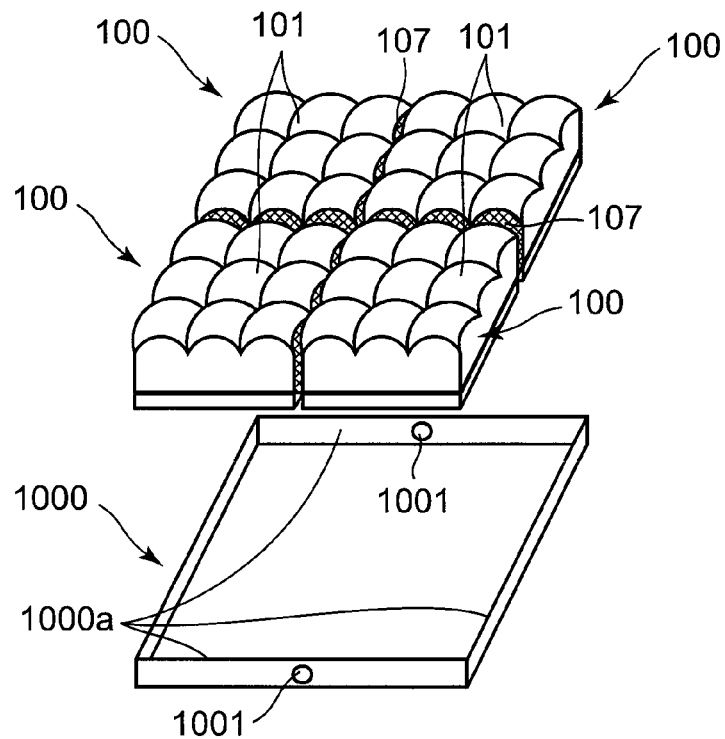
FIG. 14A is a schematic perspective view showing a method of producing the condensing photoelectric conversion apparatus according to the third embodiment of the present disclosure.

As shown in FIG. 14A, a plurality of condensing photoelectric conversion modules 100 are initially disposed two-dimensionally, and the third resin 107 is provided between the adjacent lens arrays 101.

The condensing photoelectric conversion modules 100 are disposed in a rectangular frame 1000 having a rectangular bottom plate and four side walls 1000a. The frame 1000 mechanically fixes the condensing photoelectric conversion modules 100. The condensing photoelectric conversion modules 100 can be mechanically fixed to the frame 1000 by screws, for example. The two facing side walls 1000a of the frame 1000 are each provided with a through hole 1001.

Figure 14B:
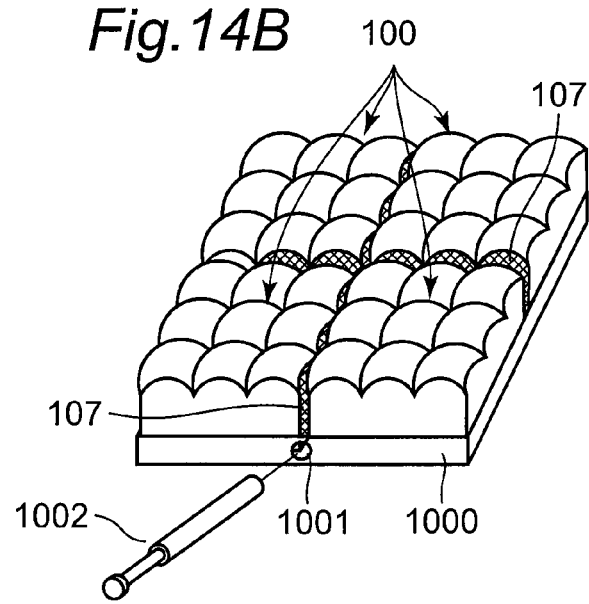
FIG. 14B is a schematic perspective view showing a method of producing the condensing photoelectric conversion apparatus according to the third embodiment of the present disclosure.
Figure 14C:
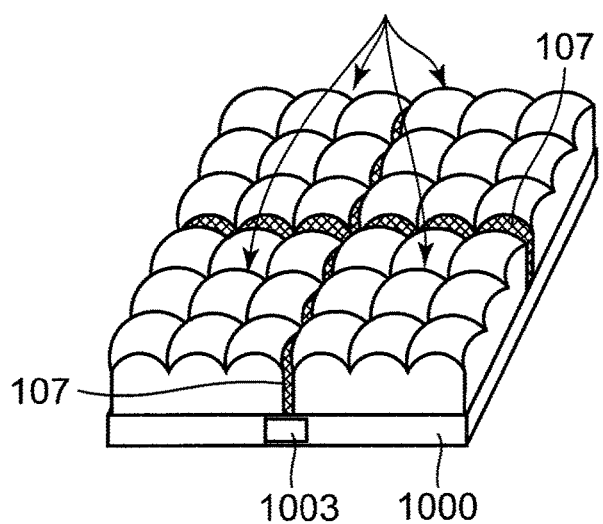
FIG. 14C is a schematic perspective view showing a method of producing the condensing photoelectric conversion apparatus according to the third embodiment of the present disclosure.

As shown in FIG. 14B, the silicone oil 901 is then injected through the through hole 1001 into the gap between the condensing photoelectric conversion modules 100 and the frame 1000 using a syringe 1002 containing the silicone oil 901.

Thereafter, the through holes 1001 are each closed by a plate 1003 as an exemplary block member. The silicone oil 901 can be prevented from leaking through the through holes 1001.

Figure 14D:
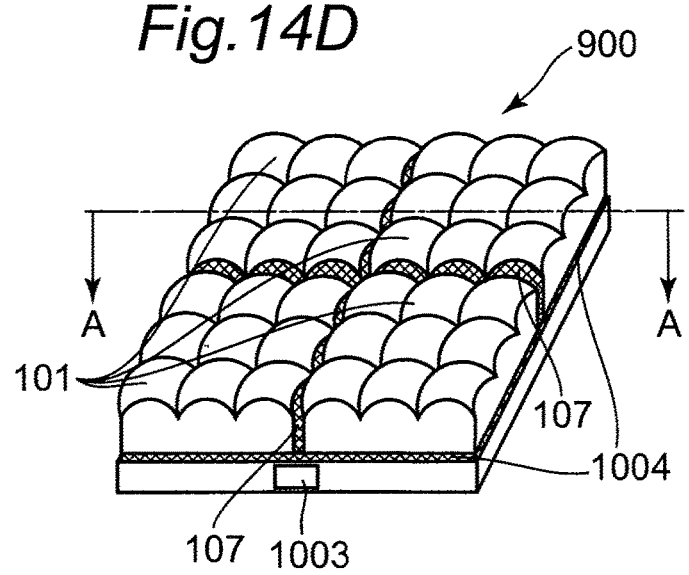
FIG. 14D is a schematic perspective view showing a method of producing the condensing photoelectric conversion apparatus according to the third embodiment of the present disclosure.

Finally, as shown in FIG. 14D, a fourth resin 1004 is provided around the lens arrays 101 of the condensing photoelectric conversion modules 100 and between the lens arrays 101 and the frame 1000, to prevent leakage of the silicone oil 901 from around the lens arrays 101 and between the lens arrays 101 and the frame 1000. Examples of the fourth resin 1004 can include an epoxy resin and a silicone resin.

In this configuration, the silicone oil 901 provided between the frame 1000 and the condensing photoelectric conversion modules 100 does not leak out of the frame 1000.

Figure 14E:
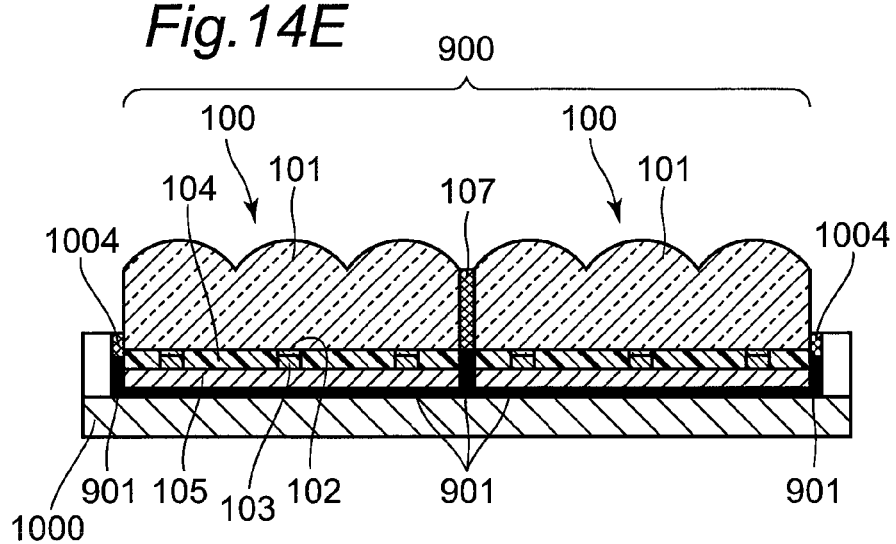
FIG. 14E is a schematic sectional view taken along line A-A in FIG. 14D, of a condensing photoelectric conversion apparatus produced by the method of producing the condensing photoelectric conversion apparatus according to the third embodiment of the present disclosure.
Figure 14F:
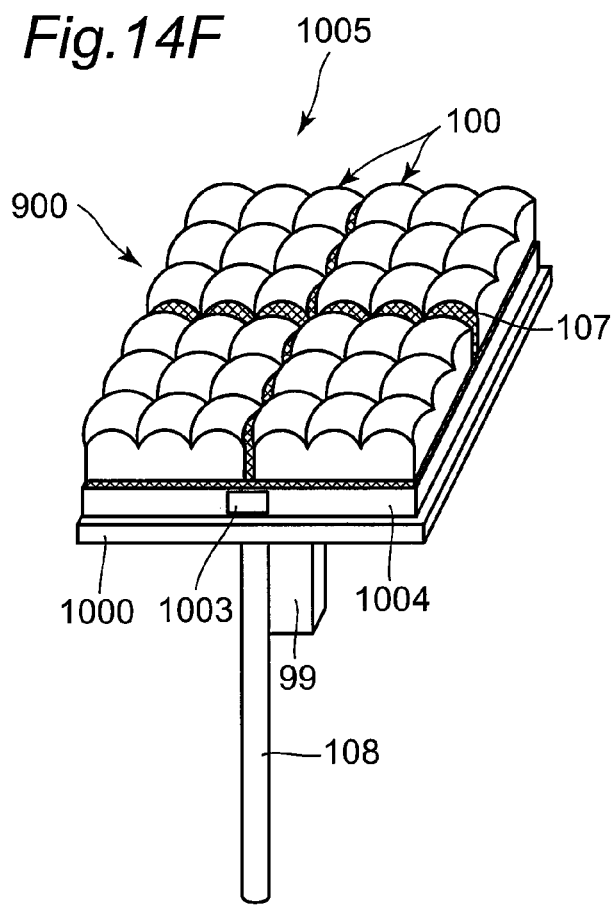
FIG. 14F is a schematic view of a condensing photoelectric conversion system according to the third embodiment of the present disclosure.

FIG. 14E is a schematic sectional view taken along line A-A, of the condensing photoelectric conversion apparatus 900 shown in FIG. 14D. FIG. 14F is a schematic view of a condensing photoelectric conversion system 1005 according to the third embodiment. In the condensing photoelectric conversion system 1005, the condensing photoelectric conversion apparatus 900 produced as shown in FIG. 14D is supported by the pillar 108 so as to be movable by the drive unit 99.

As shown in FIG. 14E, the silicone oil 901 is located between the condensing photoelectric conversion modules 100 and the frame 1000 and is in contact with the third resin 107. When the third resin 107 is deteriorated so that a cavity or a crack is formed therein or a gap is formed between the third resin 107 and the lens arrays 101, the silicone oil 901 enters the cavity, the crack, or the gap due to surface tension. Thus, even when scattering light from the colored second resin 104 passes through the third resin 107, the third resin 107 does not cause scatter or reflection because the silicone oil 901 has entered the cavity or the crack in the third resin 107 or the gap.

According to the third embodiment, the silicone oil 901 reduces the influence of deterioration of the third resin 107.

Fourth Embodiment

A condensing photoelectric conversion apparatus 1102 according to the fourth embodiment is configured identically with the condensing photoelectric conversion apparatus according to the second embodiment except for the feature that the silicone oil 901 is in contact with the third resin 107.

FIGS. 15A to 15D are schematic views showing a method of producing the condensing photoelectric conversion apparatus 1102 according to the fourth embodiment.

Figure 15A:
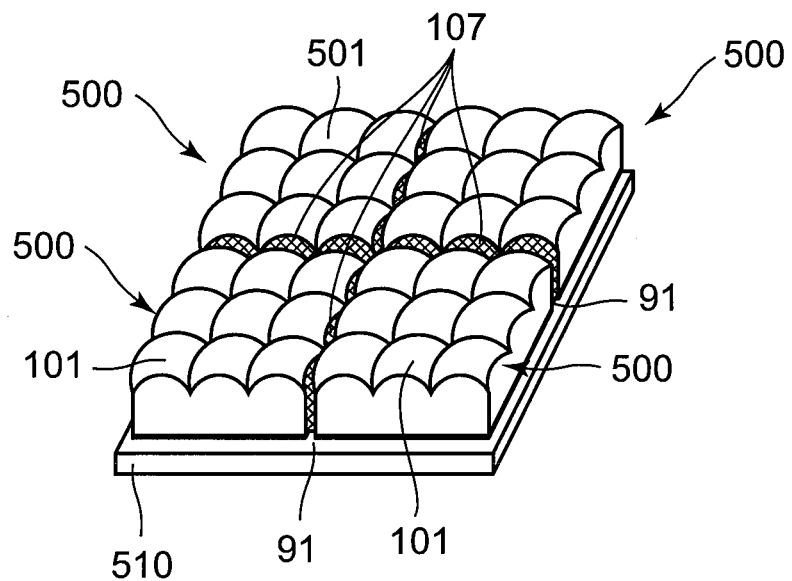
FIG. 15A is a schematic perspective view showing a method of producing a condensing photoelectric conversion apparatus according to a fourth embodiment of the present disclosure.

As shown in FIG. 15A, a plurality of condensing photoelectric conversion modules 500 are initially disposed two-dimensionally, and the third resin 107 is provided in the gap 91 between the adjacent lens arrays 101.

Figure 15B:
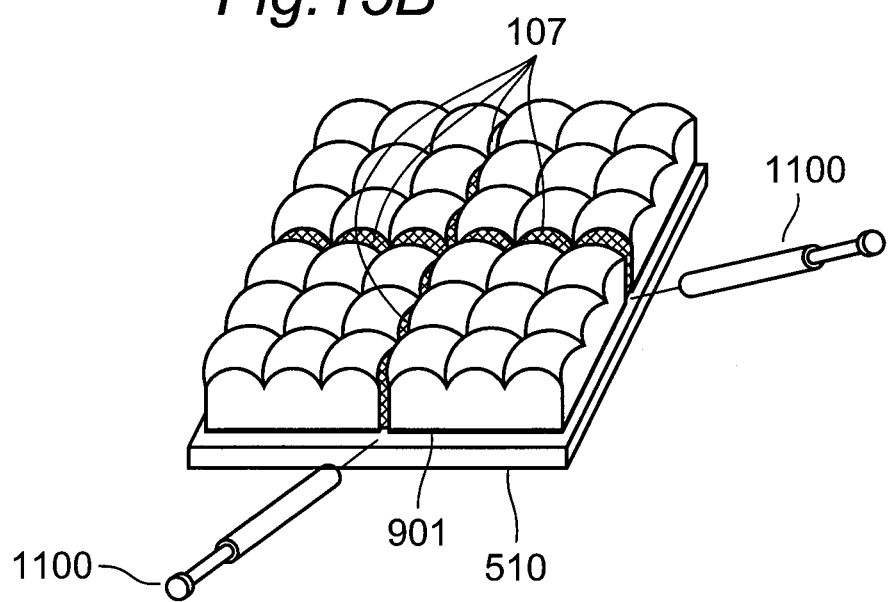
FIG. 15B is a schematic perspective view showing a method of producing a condensing photoelectric conversion apparatus according to a fourth embodiment of the present disclosure.

As shown in FIG. 15B, the silicone oil 901 is then injected into the gap 91 between the third resin 107 and a substrate 510 using a syringe 1100 containing the silicone oil 901.

Figure 15C:
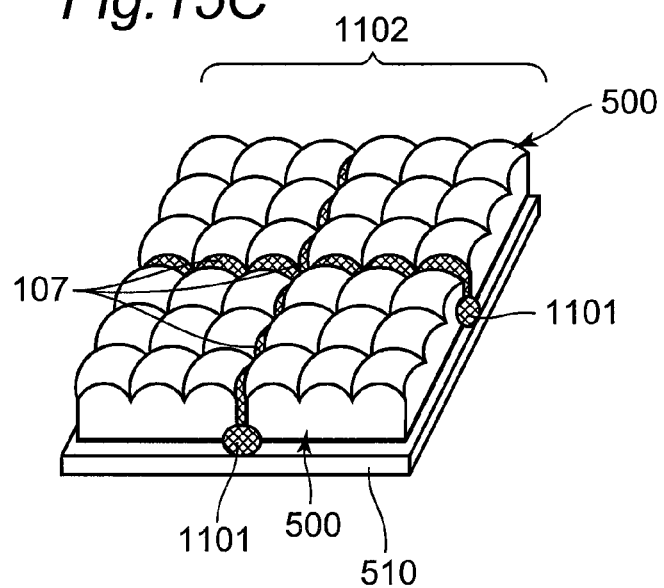
FIG. 15C is a schematic perspective view showing the method of producing the condensing photoelectric conversion apparatus according to the fourth embodiment of the present disclosure.

As shown in FIG. 15C, the outer end of the gap 91 filled with the silicone oil 901 is finally sealed with a fifth resin 1101 to prevent the injected silicone oil 901 from leaking out of the condensing photoelectric conversion modules 500. Examples of the fifth resin 1101 can include an epoxy resin and a silicone resin.

Similarly to the third embodiment, even after being placed outdoors for a long period of time, the outer color of the condensing photoelectric conversion apparatus 1102 thus configured rarely changes from the outer color of the condensing photoelectric conversion apparatus 1102 before being placed outdoors.

Figure 15D:
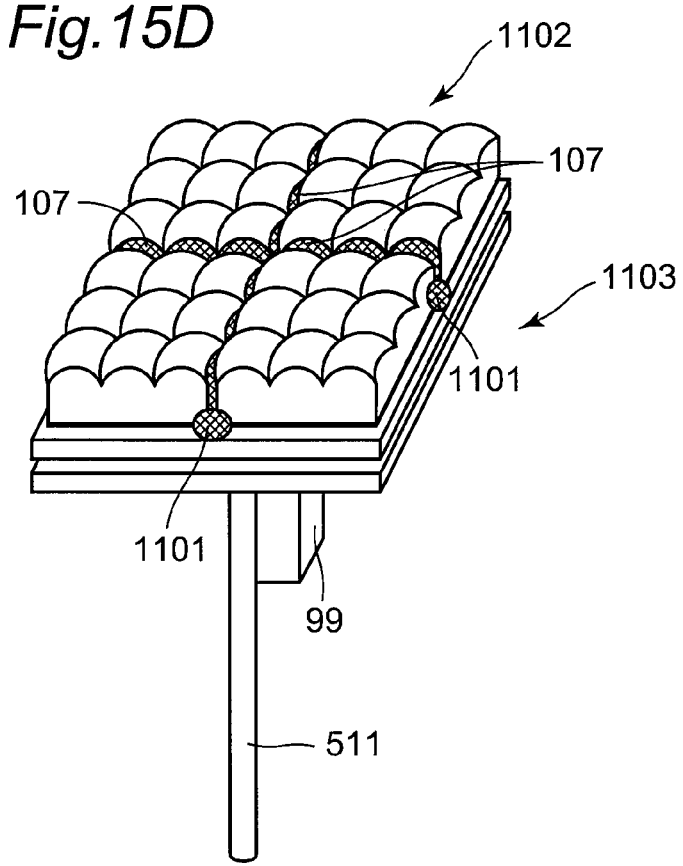
FIG. 15D is a schematic perspective view of a condensing photoelectric conversion system according to the fourth embodiment of the present disclosure.

FIG. 15D is a schematic view of a condensing photoelectric conversion system 1103. In the condensing photoelectric conversion system 1103, the condensing photoelectric conversion apparatus 1102 shown in FIG. 15C is supported by the pillar 511 so as to be movable by the drive unit 99.

Though the present disclosure has been described above based on the above first to fourth embodiments and modifications, the present disclosure should not be limited to the above-described first to fourth embodiments and modifications. For example, the present disclosure also includes the following cases.

According to a modification example, even in a case where the first resin 102 or 502 is not provided between the power generating element 103 or 503 and the condensing lens 109 or 501 but a space is formed, the present disclosure can achieve effects similar to those of the above embodiments.

In the first to fourth embodiments, the first resin 102, the second resin 104, and the third resin 107 can have insulating properties, for example.

The condensing photoelectric conversion apparatus according to each of the first to fourth embodiments of the present disclosure has been described above. These embodiments are exemplified in any aspect, and the scope of the disclosure is disclosed by the claims.

By properly combining the arbitrary embodiment(s) or modification(s) of the aforementioned various embodiments and modifications, the effects possessed by the embodiment(s) or modification(s) can be produced.

The entire disclosure of Japanese Patent Application No. 2013-124582 filed on Jun. 13, 2013, including specification, claims, drawings, and summary are incorporated herein by reference in its entirety.

INDUSTRIAL APPLICABILITY

The condensing photoelectric conversion apparatus and the system according to the present disclosure entirely appear uniform in outer color, and are applicable for an advertisement sign, decoration, or the like. In the condensing photoelectric conversion apparatus and the system according to the present disclosure, when the second resin contains a luminous agent, the second resin emits light at night. The apparatus and the system can thus function as a lighting device when placed at a location with no street lamp.

Although the present disclosure has been fully described in connection with the embodiments thereof with reference to the accompanying drawings, it is to be noted that various changes and modifications are apparent to those skilled in the art. Such changes and modifications are to be understood as included within the scope of the present disclosure as defined by the appended claims unless they depart therefrom.

What is claimed is:
1. A condensing photoelectric conversion apparatus comprising:
 a first photoelectric conversion module; and
 a second photoelectric conversion module,
 wherein the first photoelectric conversion module and the second photoelectric conversion module each comprise:
 a power generating element,
 a condensing lens located on the power generating element, the condensing lens having a front surface with a convex portion and a flat rear surface,
 a transparent first resin located between the power generating element and the rear surface of the condensing lens,
 a colored second resin located on the rear surface of the condensing lens and around the power generating element, and
 a third resin, which is a linear film, located between the condensing lens of the first photoelectric conversion module and the condensing lens of the second photoelectric conversion module and between a flat side surface of the condensing lens of the first photoelectric conversion module and a flat side surface of the condensing lens of the second photoelectric conversion module, the third resin having a refractive index $n_1$ satisfying a relational expression $n_0 - 0.05 \leq n_1 \leq n_0 + 1.0$ with a refractive index $n_0$ of the condensing lens.

2. The condensing photoelectric conversion apparatus according to claim 1, wherein the second resin is a resin into which a pigment or a dye is mixed.

3. The condensing photoelectric conversion apparatus according to claim 1, wherein the second resin is a resin containing a luminous agent.

4. The condensing photoelectric conversion apparatus according to claim 1, wherein the third resin is made of a material identical to a material for the second resin.

5. The condensing photoelectric conversion apparatus according to claim 1, wherein the third resin is in contact with a silicone-based oil, and the silicone-based oil is located on the flat rear surface of the condensing lens.

6. The condensing photoelectric conversion apparatus according to claim 5, wherein the silicone-based oil is a fluorine-modified silicone oil.

7. The condensing photoelectric conversion apparatus according to claim 1, wherein
the refractive index $n_1$ of the third resin and the refractive index $n_0$ of the condensing lens satisfy a relational expression $n_0 \leq n_1 \leq n_0 + 1.0$.

8. The photoelectric conversion apparatus according to claim 7, wherein the second resin is a resin into which a pigment or a dye is mixed.

9. The photoelectric conversion apparatus according to claim 7, wherein the second resin is a resin containing a luminous agent.

10. The photoelectric conversion apparatus according to claim 7, wherein the third resin is made of a material identical to a material for the second resin.

11. The photoelectric conversion apparatus according to claim 7, wherein the third resin is in contact with a silicone-based oil, and the silicone-based oil is located on the flat rear surface of the condensing lens.

12. The photoelectric conversion apparatus according to claim 11, wherein the silicone-based oil is a fluorine-modified silicone oil.

13. A condensing photoelectric conversion system comprising:
the condensing photoelectric conversion apparatus according to claim 1; and
a drive unit configured to drive the condensing photoelectric conversion apparatus.

14. A photoelectric conversion system comprising:
the photoelectric conversion apparatus according to claim 7; and
a drive unit configured to drive the photoelectric conversion apparatus.

* * * * *